US012487520B2

(12) United States Patent
White et al.

(10) Patent No.: US 12,487,520 B2
(45) Date of Patent: Dec. 2, 2025

(54) MULTI-LAYER PHOTORESIST SYSTEMS AND METHODS FOR MANUFACTURING ELECTROCHEMICAL DEPOSITION PRINTHEADS

(71) Applicant: FABRIC8LABS, INC., San Diego, CA (US)

(72) Inventors: Edward White, San Diego, CA (US); Shiv Shailendar, San Diego, CA (US); Ryan Nicholl, San Diego, CA (US); David Pain, Carlsbad, CA (US)

(73) Assignee: FABRIC8LABS, INC., San Diego, CA (US)

( * ) Notice: Subject to any disclaimer, the term of this patent is extended or adjusted under 35 U.S.C. 154(b) by 36 days.

(21) Appl. No.: 18/428,830

(22) Filed: Jan. 31, 2024

(65) Prior Publication Data

US 2025/0044684 A1 Feb. 6, 2025

Related U.S. Application Data

(60) Provisional application No. 63/519,748, filed on Aug. 15, 2023, provisional application No. 63/517,582, filed on Aug. 3, 2023.

(51) Int. Cl.
*G03F 7/09* (2006.01)
*G03F 7/00* (2006.01)
(Continued)

(52) U.S. Cl.
CPC .......... *G03F 7/0035* (2013.01); *G03F 7/0015* (2013.01); *G03F 7/094* (2013.01); *G03F 7/2022* (2013.01); *C23F 17/00* (2013.01)

(58) Field of Classification Search
CPC ...... G03F 7/0035; G03F 7/0015; G03F 7/094; G03F 7/2022; C23F 17/00; C25D 1/003; C25D 5/022; C25D 7/00
See application file for complete search history.

(56) References Cited

U.S. PATENT DOCUMENTS 4,767,721 A * 8/1988 Liao ...................... H01L 21/266
438/420
5,258,264 A * 11/1993 Mathad ............... H01L 21/7688
430/315

(Continued)

FOREIGN PATENT DOCUMENTS

EP 0844090 A2 * 5/1998 ............ B41J 2/1628

*Primary Examiner* — Hung V Nguyen
(74) *Attorney, Agent, or Firm* — Kunzler Bean & Adamson

(57) ABSTRACT

A method of forming a printhead of an electrochemical deposition system includes applying at least one first photosensitive resist layer onto a substrate including a connection circuit, exposing a portion of the at least one first photosensitive resist layer to a first light such that a first-layer region is defined, applying at least one second photosensitive resist layer onto the at least one first photosensitive resist layer, and exposing a portion of the at least one second photosensitive resist layer to a second light such that a second-layer region, at least partially overlapping the first-layer region, is defined. The method further includes developing the at least one first photosensitive resist layer and the at least one second photosensitive resist layer to remove the second-layer region and at least a portion of the first-layer region, such that an aperture is formed with an overhang portion.

27 Claims, 14 Drawing Sheets

(51) Int. Cl.
*G03F 7/20* (2006.01)
*C23F 17/00* (2006.01)

(56) References Cited

U.S. PATENT DOCUMENTS

| | | | |
|---|---|---|---|
| 7,176,066 B2* | 2/2007 | Brenner .................. | G06N 10/00 |
| | | | 438/525 |
| 7,229,745 B2* | 6/2007 | Lamarre .................. | G03F 7/095 |
| | | | 430/394 |

* cited by examiner

MULTI-LAYER PHOTORESIST SYSTEMS AND METHODS FOR MANUFACTURING ELECTROCHEMICAL DEPOSITION PRINTHEADS

CROSS-REFERENCE TO RELATED APPLICATIONS

This application claims the benefit of U.S. Provisional Patent Application No. 63/517,582, filed Aug. 3, 2023, and U.S. Provisional Patent Application No. 63/519,748, filed Aug. 15, 2023, which are incorporated herein by reference in their entirety.

FIELD

This disclosure relates generally to manufacturing parts, and more particularly to methods of forming multiple photoresist layers on a substrate.

BACKGROUND

Patterned layers are part of many electronic components. For example, patterned metal layers may be used to create electrode arrays for both measurement and stimulation. They have uses in many diverse areas such as medical research, medical implants, semiconductor manufacturing, electrochemical additive manufacturing, etc.

Manufacturing electrode arrays can be difficult, especially for applications that require a high area number density of electrodes. Electrode arrays can be formed by depositing a metallic material on or in a substrate.

SUMMARY

The subject matter of the present application has been developed in response to the present state of the art, and in particular, in response to the shortcomings of conventional methods for forming metallization layers on a substrate, that have not yet been fully solved by currently available techniques. Accordingly, the subject matter of the present application has been developed to provide methods for forming multiple photoresist layers and a corresponding metallization layer on a substrate that overcome at least some of the shortcomings of prior art techniques.

The following is a non-exhaustive list of examples, which may or may not be claimed, of the subject matter, disclosed herein.

Disclosed herein is a method of forming a printhead of an electrochemical deposition system. The method includes applying at least one first photosensitive resist layer onto a substrate including a connection circuit. The method also includes exposing a portion of the at least one first photosensitive resist layer to a first light such that a first-layer region is defined by the portion of the at least one first photosensitive resist layer exposed to the first light. The method further includes applying at least one second photosensitive resist layer onto the at least one first photosensitive resist layer. The method additionally includes exposing a portion of the at least one second photosensitive resist layer to a second light such that a second-layer region, at least partially overlapping the first-layer region, is defined by the portion of the at least one second photosensitive resist layer exposed to the second light. The method further includes developing the at least one first photosensitive resist layer and the at least one second photosensitive resist layer to remove the second-layer region and at least a portion of the first-layer region, such that an aperture is formed through the at least one first photosensitive layer and the at least one second photosensitive layer and such that an overhanging portion of the at least one second photosensitive layer overhangs the at least one first photosensitive layer. The method additionally includes applying a metallic material onto the substrate through the aperture such that the metallic material is capable of establishing an electrical connection with the connection circuit. The method also includes removing the at least one first photosensitive resist layer and the at least one second photosensitive resist layer from the substrate. The preceding subject matter of this paragraph characterizes example 1 of the present disclosure.

Applying the metallic material onto the substrate includes sputtering a sputtering metallic material onto the substrate. The preceding subject matter of this paragraph characterizes example 2 of the present disclosure, wherein example 2 also includes the subject matter according to example 1, above.

Applying the metallic material onto the substrate further includes plating a plating metallic material onto the sputtering metallic material by electrically energizing the connection circuit. The preceding subject matter of this paragraph characterizes example 3 of the present disclosure, wherein example 3 also includes the subject matter according to example 2, above.

The step of plating the plating metallic material onto the sputtering metallic material, by electrically energizing the connection circuit, occurs after the step of removing the at least one first photosensitive resist layer and the at least one second photosensitive resist layer from the substrate. The preceding subject matter of this paragraph characterizes example 4 of the present disclosure, wherein example 4 also includes the subject matter according to example 3, above.

An area of the metallic material applied onto the connection circuit is greater than an area occupied by the connection circuit. The preceding subject matter of this paragraph characterizes example 5 of the present disclosure, wherein example 5 also includes the subject matter according to any of examples 2-4, above.

An area of the metallic material applied onto the connection circuit is less than an area occupied by the connection circuit. The preceding subject matter of this paragraph characterizes example 6 of the present disclosure, wherein example 6 also includes the subject matter according to any of examples 2-5, above.

Applying the metallic material onto the substrate includes applying a layer of the metallic material onto the substrate, through the aperture, and onto the at least one second photosensitive resist layer. Removing the at least one first photosensitive resist layer and the at least one second photosensitive resist layer from the substrate also removes a portion of the layer of the metallic material on the at least one second photosensitive resist layer. The preceding subject matter of this paragraph characterizes example 7 of the present disclosure, wherein example 7 also includes the subject matter according to any of examples 1-6, above.

An area of the metallic material applied onto the substrate is greater than a second-layer area of the second-layer region. The preceding subject matter of this paragraph characterizes example 8 of the present disclosure, wherein example 8 also includes the subject matter according to any of examples 1-7, above.

Exposing the portion of the at least one first photosensitive resist layer to the first light to define the first-layer region includes positioning a first patterned mask onto the at least one first photosensitive resist layer and transmitting the first light through a pattern in the first patterned mask.

Exposing the portion of the second photosensitive resist layer to the second light to define the second-layer region includes positioning a second patterned mask onto the at least one second photosensitive resist layer and transmitting the second light through a pattern in the second patterned mask. The preceding subject matter of this paragraph characterizes example 9 of the present disclosure, wherein example 9 also includes the subject matter according to any of examples 1-8, above.

Developing the at least one first photosensitive resist layer and the at least one second photosensitive resist layer includes concurrently exposing the first-layer region and the second-layer region to at least one solvent. The preceding subject matter of this paragraph characterizes example 10 of the present disclosure, wherein example 10 also includes the subject matter according to any of examples 1-9, above.

The at least one first photosensitive resist layer defines a first portion of the aperture having a first width in a width direction. The at least one second photosensitive resist layer defines a second portion of the aperture having a second width in the width direction. The first width is greater than the second width. The preceding subject matter of this paragraph characterizes example 11 of the present disclosure, wherein example 11 also includes the subject matter according to any of examples 1-10, above.

The second width is constant in a height direction away from the substrate and perpendicular to the width direction. The first width decreases in the height direction. The preceding subject matter of this paragraph characterizes example 12 of the present disclosure, wherein example 12 also includes the subject matter according to example 11, above.

The at least one first photosensitive resist layer includes at least two first photosensitive resist layers. The preceding subject matter of this paragraph characterizes example 13 of the present disclosure, wherein example 13 also includes the subject matter according to any of examples 1-12, above.

A first-layer area of a portion of the first-layer region defined by an inner one of the at least two first photosensitive resist layers is greater than a first-layer area of a portion of the first-layer region defined by an outer one of the at least two first photosensitive resist layers. The outer one of the at least two first photosensitive resist layers is interposed between the inner one of the at least two first photosensitive resist layers and the at least one second photosensitive resist layer. The preceding subject matter of this paragraph characterizes example 14 of the present disclosure, wherein example 14 also includes the subject matter according to example 13, above.

The substrate has a non-planar topography. The at least one first photosensitive resist layer is applied onto the non-planar topography of the substrate. The metallic material is applied onto the non-planar topography of the substrate through the aperture. The preceding subject matter of this paragraph characterizes example 15 of the present disclosure, wherein example 15 also includes the subject matter according to any of examples 1-14, above.

The substrate includes a base and a polyimide insulator layer coupled to the base. The non-planar topography is defined by the polyimide insulator layer. The preceding subject matter of this paragraph characterizes example 16 of the present disclosure, wherein example 16 also includes the subject matter according to example 15, above.

The portion of the at least one first photosensitive resist layer is exposed to the first light such that a plurality of first-layer regions, spaced apart from each other, are defined by the portion of the at least one first photosensitive resist layer exposed to the first light. The portion of the at least one second photosensitive resist layer is exposed to the second light such that a plurality of second-layer regions, spaced apart from each other and each located within a footprint of a corresponding one of the first-layer regions, are defined by the portion of the at least one second photosensitive resist layer exposed to the second light. The at least one first photosensitive resist layer and the at least one second photosensitive resist layer are developed to remove the plurality of second-layer regions and at least a portion of each one of the plurality of first-layer regions such that a plurality of apertures are formed through the at least one first photosensitive layer and the at least one second photosensitive layer. The metallic material is applied onto the substrate through one or more of the plurality of apertures. The preceding subject matter of this paragraph characterizes example 17 of the present disclosure, wherein example 17 also includes the subject matter according to any of examples 1-16, above.

The method further includes heat treating the at least one first photosensitive resist layer after exposing the portion of the at least one first photosensitive resist layer to the first light and before applying the at least one second photosensitive resist layer onto the at least one first photosensitive resist layer. The preceding subject matter of this paragraph characterizes example 18 of the present disclosure, wherein example 18 also includes the subject matter according to any of examples 1-17, above.

The at least one first photosensitive resist layer is made of a first photosensitive resist material. The at least one second photosensitive resist layer is made of a second photosensitive resist material. The first photosensitive resist material and the second photosensitive resist material are different types of photosensitive resist material. The preceding subject matter of this paragraph characterizes example 19 of the present disclosure, wherein example 19 also includes the subject matter according to any of examples 1-18, above.

The method further comprises applying at least one of an adhesive promoter or a mixing barrier between the at least one first photosensitive resist layer and the at least one second photosensitive resist layer. The preceding subject matter of this paragraph characterizes example 20 of the present disclosure, wherein example 20 also includes the subject matter according to any of examples 1-19, above.

The at least one first photosensitive resist layer and the at least one second photosensitive resist layer are made of the same type of photosensitive resist material. The preceding subject matter of this paragraph characterizes example 21 of the present disclosure, wherein example 21 also includes the subject matter according to any of examples 1-20, above.

The at least one first photosensitive resist layer and the at least one second photosensitive resist layer are made of a positive photosensitive resist material. The preceding subject matter of this paragraph characterizes example 22 of the present disclosure, wherein example 22 also includes the subject matter according to any of examples 1-21, above.

The at least one first photosensitive resist layer and the at least one second photosensitive resist layer are made of a negative photosensitive resist material. The preceding subject matter of this paragraph characterizes example 23 of the present disclosure, wherein example 23 also includes the subject matter according to any of examples 1-22, above.

One of the at least one first photosensitive resist layer and the at least one second photosensitive resist layer is made of a positive photosensitive resist material and the other one of the at least one first photosensitive resist layer and the at least one second photosensitive resist layer is made of a negative photosensitive resist material. The preceding subject matter of this paragraph characterizes example 24 of the present disclosure, wherein example 24 also includes the subject matter according to any of examples 1-23, above.

The method further includes selecting a time period between applying the at least one second photosensitive resist layer onto the at least one first photosensitive resist layer and exposing the portion of the at least one second photosensitive resist layer to the second light based on a predetermined mixing of the at least one first photosensitive resist layer and the at least one second photosensitive resist layer. The preceding subject matter of this paragraph characterizes example 25 of the present disclosure, wherein example 25 also includes the subject matter according to any of examples 1-24, above.

The method further includes selecting a time period between applying the at least one second photosensitive resist layer onto the at least one first photosensitive resist layer and exposing the portion of the at least one second photosensitive resist layer to the second light based on a predetermined side profile of the aperture. The preceding subject matter of this paragraph characterizes example 26 of the present disclosure, wherein example 26 also includes the subject matter according to any of examples 1-25, above.

Applying the at least one first photosensitive resist layer onto the substrate includes at least one of spin coating, slot-die coating, doctor blading, or bar coating the at least one first photosensitive resist layer onto the substrate. Applying the at least one second photosensitive resist layer onto the at least one first photosensitive resist layer includes at least one of spin coating, slot-die coating, doctor blading, or bar coating the at least one second photosensitive resist layer onto the at least one first photosensitive resist layer. The preceding subject matter of this paragraph characterizes example 27 of the present disclosure, wherein example 27 also includes the subject matter according to any of examples 1-26, above.

Further disclosed herein is a method that includes applying at least one first photosensitive resist layer onto a substrate. The method also includes exposing a portion of the at least one first photosensitive resist layer to a first light such that a first-layer region is defined by the portion of the at least one first photosensitive resist layer exposed to the first light. The method further includes applying at least one second photosensitive resist layer onto the at least one first photosensitive resist layer. The method additionally includes exposing a portion of the at least one second photosensitive resist layer to a second light such that a second-layer region, at least partially overlapping the first-layer region, is defined by the portion of the at least one second photosensitive resist layer exposed to the second light. The method also includes developing the at least one first photosensitive resist layer and the at least one second photosensitive resist layer to remove the second-layer region and at least a portion of the first-layer region, such that an aperture is formed through the at least one first photosensitive layer and the at least one second photosensitive layer and such that an overhanging portion of the at least one second photosensitive layer overhangs the at least one first photosensitive layer. The preceding subject matter of this paragraph characterizes example 28 of the present disclosure.

The described features, structures, advantages, and/or characteristics of the subject matter of the present disclosure may be combined in any suitable manner in one or more examples and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example or implementation. In other instances, additional features and advantages may be recognized in certain examples and/or implementations that may not be present in all examples or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific examples that are illustrated in the appended drawings. Understanding that these drawings, which are not necessarily drawn to scale, depict only certain examples of the subject matter and are not therefore to be considered to be limiting of its scope, the subject matter will be described and explained with additional specificity and detail through the use of the drawings, in which.

DETAILED DESCRIPTION

Reference throughout this specification to "one example," "an example," or similar language means that a particular feature, structure, or characteristic described in connection with the example is included in at least one example of the present disclosure. Appearances of the phrases "in one example," "in an example," and similar language throughout this specification may, but do not necessarily, all refer to the same example. Similarly, the use of the term "implementation" means an implementation having a particular feature, structure, or characteristic described in connection with one or more examples of the present disclosure, however, absent an express correlation to indicate otherwise, an implementation may be associated with one or more examples.

Patterned coating is one of the cornerstones of nanofabrication. An illustrative example of patterned coating of metallization layers on a substrate can be found in the manufacture of electrode array printheads for electrochemical additive manufacturing. Electrochemical additive manufacturing utilizes electrochemical reactions to manufacture parts in an additive manufacturing manner. In an electrochemical additive manufacturing process, a metal part is constructed by plating charged metal ions onto a surface of a cathode in an electrolyte solution. This technique relies on placing an electrode (i.e., anode) physically close to the cathode in the presence of a deposition solution (the electrolyte), and energizing the electrode causing charge to flow through the electrode. This creates an electrochemical reduction reaction to occur at the cathode near the electrode and deposition of material on the cathode. Electrochemical additive manufacturing techniques provide distinct advantages over other types of additive manufacturing processes, such as selective laser melting and electron beam melting.

Figure 1:
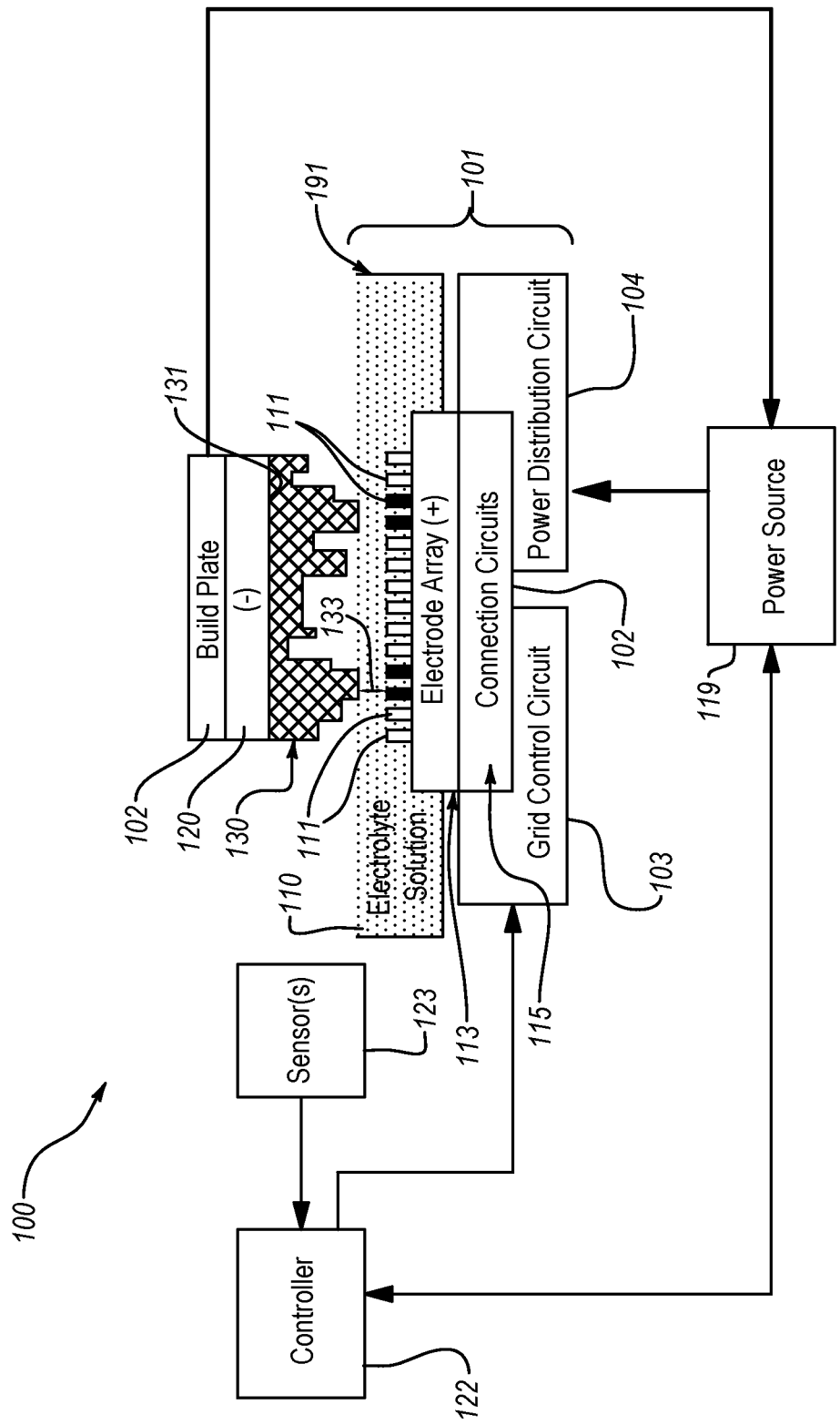
FIG. 1 is a schematic, side elevation view of an electrochemical deposition system for manufacturing a part, according to one or more examples of the present disclosure.

Referring to FIG. 1, according to some examples, an electrochemical deposition system 100 includes a printhead 101 that contains a substrate and at least one electrode 111 coupled with the substrate. In certain examples, the printhead 101 contains a plurality of electrodes 111 arranged into an electrode array 113 on the substrate. The printhead 101 further includes at least one connection circuit 115 corresponding with each one of the electrodes 111 of the printhead 101. The at least one connection circuit 115 is integrated into the substrate of the printhead 101. Accordingly, in examples where the printhead 101 contains an electrode array 113, the printhead 101 includes a plurality of connection circuits 115 integrated into the substrate. The connection circuits 115 can be organized into a matrix arrangement, in some examples, thereby supporting a high resolution of electrodes 111. The electrodes 111 of the electrode array 113 are arranged to form a two-dimensional grid in some examples. In FIG. 1, one dimension of the grid is shown with the other dimension of the grid going into and/or coming out of the page.

The printhead 101 further includes a grid control circuit 103 that transmits control signals to the connection circuits 115 to control the amount of electrical current flowing through each one of the electrodes 111 of the electrode array 113. The printhead 101 additionally includes a power distribution circuit 104. The electrical current, supplied to the electrodes 111 via control of the grid control circuit 103, is provided by the power distribution circuit 104, which routes power from an electrical power source 119 of the electrochemical deposition system 100 to the connection circuits 115 and then to the electrodes 111. Although not shown, in some examples, the printhead 101 also includes features, such as insulation layers, that can help protect the electrodes 111 and other features of the printhead 101 from an electrolyte solution 110, as described in more detail below.

The electrochemical deposition system 100 further includes a build plate 102 and the electrolyte solution 110, which can be contained within a partially enclosed container or electrodeposition cell 191. In some examples, the electrolyte solution 110 includes one or more of, but not limited to, plating baths, associated with copper, nickel, tin, silver, gold, lead, etc., and which typically include of water, an acid (such as sulfuric acid), metallic salt, and additives (such as levelers, suppressors, surfactants, accelerators, grain refiners, and pH buffers).

The electrochemical deposition system 100 is configured to move the printhead 101 relative to the electrolyte solution 110 such that the electrodes 111 of the electrode array 113 are submersed in the electrolyte solution 110. When submersed in the electrolyte solution 110, as shown in FIG. 1, when the build plate 102 and at least one of the electrodes 111 are connected to an electrical power source 119, and when an electrical current is supplied to the electrodes 111 from the electrical power source 119, an electrical path (or current) is formed through the electrolyte solution 110 from each one of the electrodes 111 to a conductive surface 131 of a cathode portion 120 of the build plate 102. In such an example, the cathode portion 120 functions as the cathode the cathode-anode circuit of the electrochemical deposition system 100. The electrical paths in the electrolyte solution 110 induce electrochemical reactions in the electrolyte solution 110, between the electrodes 111 and the conductive surface 131 of the cathode portion 120, which results in the formation (e.g., deposition) of material 130 (e.g., layers of metal) on the conductive surface 131 of the cathode portion 120 at locations corresponding to the locations of the electrodes 111. The material 130, which can be layers of metal, formed by supplying electrical current to multiple electrodes 111 form one or more layers or portions of a part in some examples.

In some examples, the electrodes 111 of the electrode array 113 are densely packed on the substrate of the printhead 101. The area number density or area concentration of the electrodes 111 is proportional to the resolution of the object capable of being formed from the material 130 deposited onto the build plate 102. Generally, the higher the area number density of the electrodes 111, the higher the resolution, detail, and accuracy of the object that can be made from the material 130. However, making printheads with electrode arrays having a densely packed distribution of electrodes can be difficult. As the desired area number density of electrodes increases, the difficulty and complexity of making a printhead meeting the desired area number density also increases. Described herein are examples of a method of making an electrode on a substrate that promotes the manufacturing of densely packed electrode arrays on substrates for a variety of purposes, such as electrochemical additive manufacturing.

Figure 28:
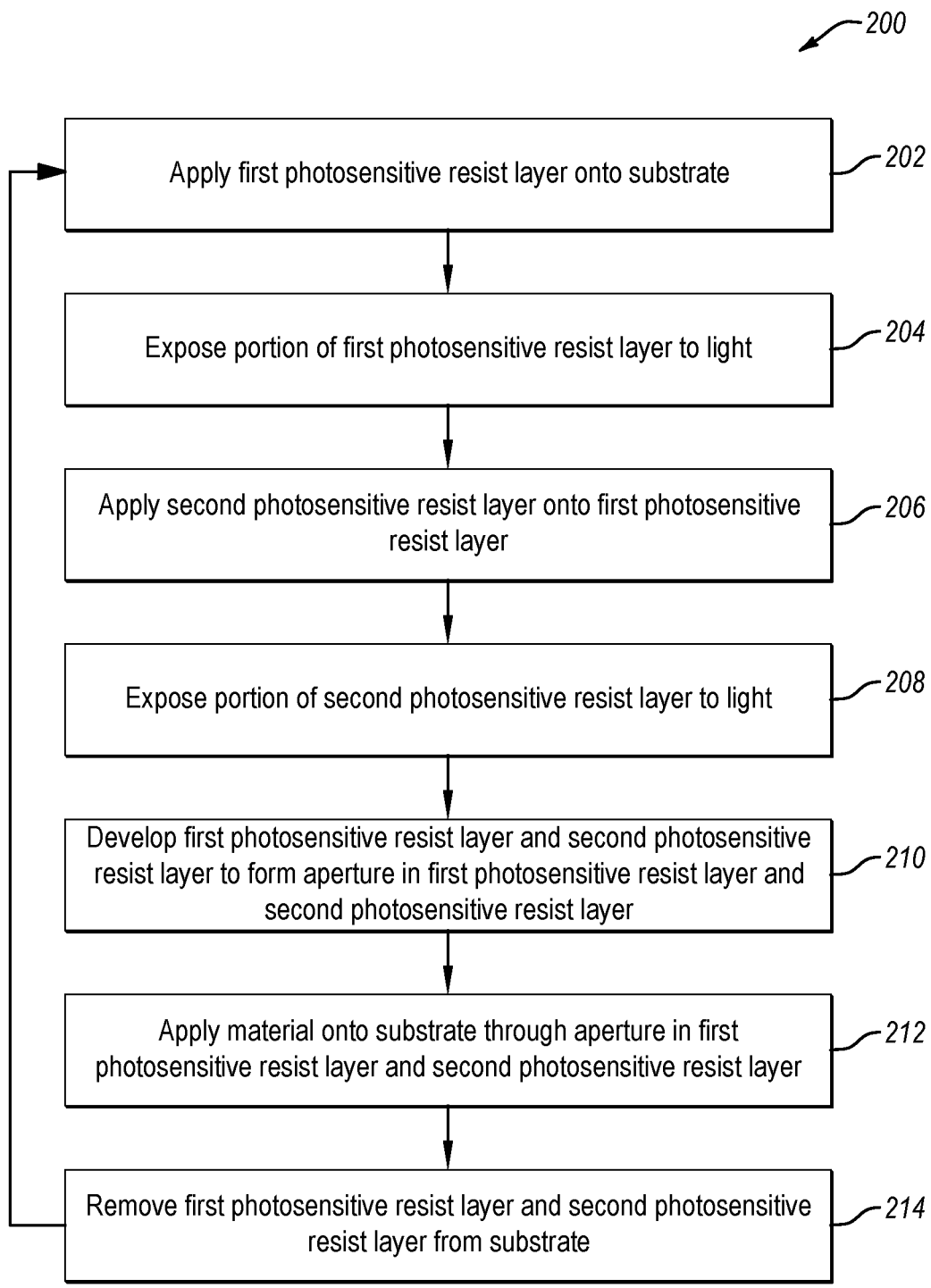
FIG. 28 is a block diagram of a method of forming at least one electrode on a substrate, according to one or more examples of the present disclosure.

Referring generally to FIG. 28 and particularly to FIGS. 2-9, according to some examples, a method 200 of forming at least one electrode 311 on a substrate 300 is shown. The electrode 311 and the substrate 300 form at least part of an electronic device 331 (see, e.g., FIG. 9). The electronic device 331 can be any of various types of electronic devices for use in any of various types of applications and to provide any of various types of functions. According to one example, the electronic device 331 forms at least part of the printhead 101 of the electrochemical deposition system 100. Accordingly, the electrode 311 can be activated or energized to effectuate a deposit of material onto a build plate during an electrochemical deposition process. However, in other examples, the electronic device 331 can form part of an electronic communication or processing device, such as an integrated circuit, printed circuit board, and the like. The electronic device 331 can have an array of electrodes 311 and be used for medical research, medical implants, semiconductor manufacturing, and the like. The substrate 300 is made of an electrically-insulating material, such as non-metals (e.g., polymeric materials). However, the substrate 300 can include electrically-conducting materials, such as for forming one or more electrical circuits embedded or integrated in the substrate. In some examples, as shown in FIGS. 2-9, the substrate 300 includes a connection circuit 315, similar to the connection circuit 115, which facilitates an electrical connection between the electrode 311 and one or more electrical devices within, attached to, or electrically connected to the substrate 300. The connection circuit 315 can be a simple or complex electrical circuit that is electrically connected to the electrode 311 at a processing surface 360 of the substrate 300. The processing surface 360 is a planar or non-planar exterior surface of the substrate 300 configured to receive further processing or provide processing functionality. It is recognized, by the use of dashed lines representing the connection circuit 315, that the substrate 300 does not include a connection circuit in some examples or that a connection circuit in the substrate 300 is optional.

In the examples of side cross-sectional views used throughout this disclosure, it is to be understood that electrode arrays may be one or more dimensional with various electrode materials, sizes, spacings and patterns as dictated by the target application. In example illustrations, electrode connections are shown as being below an insulator layer of a substrate, while in other illustrations, the electrode connections may be shown flush with the surface. It should be noted that in various examples, these electrode connections may be flush with the surface of the substrate, above the surface, or below the surface, regardless of how they are depicted in the figures of this disclosure. The electrode connections may be doped semiconductors such as silicon, metal, and/or other materials as known in the art.

Figure 2:
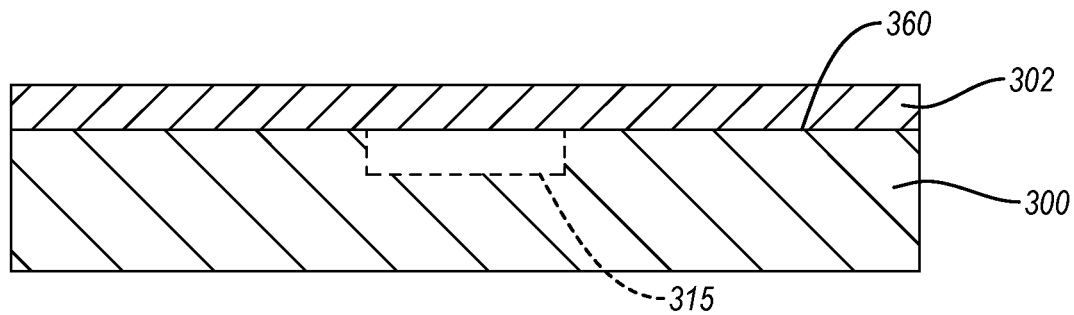
FIG. 2 is a schematic, side elevation sectional view of a first photosensitive resist layer applied onto a substrate, according to one or more examples of the present disclosure.

Referring to FIGS. 2 and 28, the method 200 includes (block 202) applying a first photosensitive resist layer 302 onto the substrate 300. As shown, the first photosensitive resist layer 302 is applied onto the processing surface 360 of the substrate 300. When the substrate 300 includes the connection circuit 315, the first photosensitive resist layer 302 is applied over the connection circuit 315. The first photosensitive resist layer 302 is made of any of various photosensitive resist materials and can be applied using any of various photosensitive resist application techniques, such as spin coating, dip coating, roller coating, spray coating, and the like. The photosensitive resist material of the first photosensitive resist layer 302 can be a negative photosensitive resist material or a positive photosensitive resist material. Moreover, the photosensitive resist material of the first photosensitive resist layer 302 can have any of various processing properties that affect the light properties necessary to either sufficiently degrade (positive photoresist) or strengthen (negative photoresist) the photosensitive resist material when exposed by the light, the type of developer solvent necessary to remove either the exposed portion or portion surrounding the exposed portion, and/or the type of lift-off solvent necessary to remove the photosensitive resist material from the substrate 300.

Although the first photosensitive resist layer 302 is shown as a single layer, in some examples, the first photosensitive resist layer 302 can be multiple layers or include sub-layers applied onto top of each other in a stacked formation. Accordingly, references herein to the first photosensitive resist layer 302 can also mean the at least one first photosensitive resist layer 302 or multiple first photosensitive resist layers 302.

Figure 3:
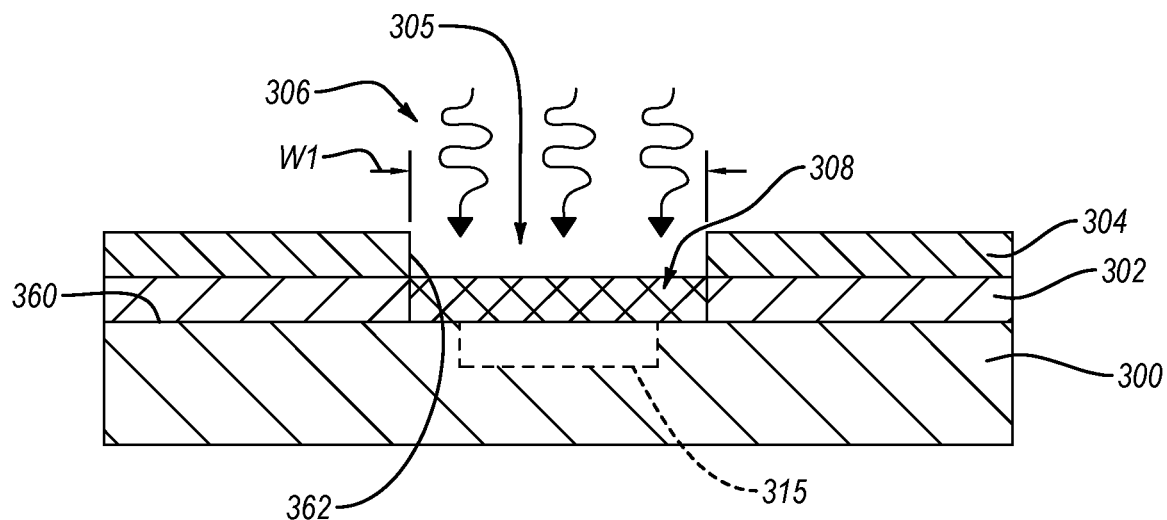
FIG. 3 is a schematic, side elevation sectional view of a first patterned mask on the photosensitive resist layer of FIG. 2, according to one or more examples of the present disclosure.

Referring to FIGS. 3 and 28, after the first photosensitive resist layer 302 is applied onto the substrate 300 at block 202, the method 200 includes (block 204) exposing a portion of the first photosensitive resist layer 302 to light 306 such that a first-layer region 308 is defined by the portion of the first photosensitive resist layer 302 exposed to the light 306. Depending on the type of photosensitive resist material (i.e., positive or negative), the first-layer region 308 is the exposed portion of the photosensitive resist material when the material is a positive photoresist and the first-layer region 308 is an unexposed portion of the photosensitive resist material when the material is a negative photoresist. In the illustrated example, the first photosensitive resist layer 302 is made of a positive photoresist such that the first-layer region 308 is exposed to the light 306. Accordingly, in some examples, exposing the portion of the first photosensitive resist layer 302 to the light 306, to define the first-layer region 308, includes positioning a first patterned mask 304 onto the first photosensitive resist layer 302 and transmitting the light 306 through a first pattern 305, having at least one first-mask aperture 362, in the first patterned mask 304. According to some examples, after exposing the portion of the first photosensitive resist layer 302 at block 204, the method 200 can include heat treating (e.g., baking) the first photosensitive resist layer 302 before proceeding to block 206.

The first-layer region 308 has a width W1 that corresponds with the width of the first-mask aperture 362. The width W1 corresponds with a dimension of the first-layer region 308 in a width direction 321 (see, e.g., FIG. 6), which is a substantially lateral direction along (e.g., generally parallel to) the processing surface 360. The width W1 can be a maximum width or dimension of the first-layer region 308 in the width direction 321. When the first-mask aperture 362 has a circular cross-sectional shape, the width W1 is a diameter of the first-layer region 308. The width W1 also corresponds with a first-layer area of the first-layer region 308. The first-layer area of the first-layer region 308 is the area of the first-layer region 308 within a plane that is parallel to the width direction 321. Accordingly, the width W1 is a factor in the calculation of the first-layer area such that the first-layer area is dependent on (e.g., proportional to) the width W1.

Figure 4:
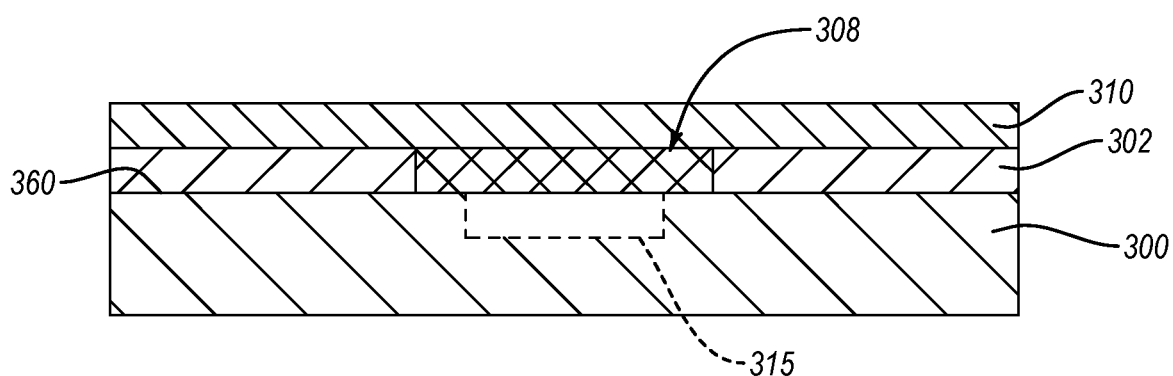
FIG. 4 is a schematic, side elevation sectional view of a second photosensitive resist layer applied onto the first photosensitive resist layer of FIG. 2, according to one or more examples of the present disclosure.

Referring to FIGS. 4 and 28, after the first-layer region 308 is defined by exposing the portion of the first photosensitive resist layer 302 at block 204, the method 200 additionally includes (block 206) applying a second photosensitive resist layer 310 onto the first photosensitive resist layer 302. The second photosensitive resist layer 310 overlays the first-layer region 308 of the first photosensitive resist layer 302. Like the first photosensitive resist layer 302, the second photosensitive resist layer 310 can be made of any of various photosensitive resist materials and can be applied using any of various photosensitive resist application techniques, such as those listed above. The photosensitive resist material of the second photosensitive resist layer 310 can be a negative photosensitive resist material or a positive photosensitive resist material. Moreover, the photosensitive resist material of the second photosensitive resist layer 310 can have any of various processing properties that affect the light properties necessary to either sufficiently degrade (positive photoresist) or strengthen (negative photoresist) the photosensitive resist material when exposed by the light, the type of developer solvent necessary to remove either the exposed portion or portion surrounding the exposed portion, and/or the type of lift-off solvent necessary to remove the photosensitive resist material from the substrate 300.

In some examples, the first photosensitive resist layer 302 and the second photosensitive resist layer 310 are made of the same type of photosensitive resist material (i.e., are both positive photoresists or negative photoresist, have the same processing properties, etc.). However, in other examples, the first photosensitive resist layer 302 is made of a different type of photosensitive resist material than that of the second photosensitive resist layer 310 (i.e., has at least one processing property that is different). According to one example, the photosensitive resist material of the first photosensitive resist layer 302 is one of a negative or positive photoresist, and the photosensitive resist material of the second photosensitive resist layer 310 is the other of the negative or positive photoresist.

Although the second photosensitive resist layer 310 is shown as a single layer, in some examples, the second photosensitive resist layer 310 can be multiple layers or include sub-layers applied onto top of each other in a stacked formation. Accordingly, references herein to the second photosensitive resist layer 310 can also mean the at least one second photosensitive resist layer 310 or multiple second photosensitive resist layers 310.

In some examples, applying the at least one first photosensitive resist layer 302 onto the substrate 300 can include at least one of spin coating, slot-die coating, doctor blading, or bar coating the at least one first photosensitive resist layer 302 onto the substrate 300. Similarly, in some examples, applying the at least one second photosensitive resist layer 310 onto the at least one first photosensitive resist layer 302 includes at least one of spin coating, slot-die coating, doctor blading, or bar coating the at least one second photosensitive resist layer 310 onto the at least one first photosensitive resist layer 302.

According to certain examples, the method 200 can include applying at least one of an adhesive promoter or a mixing barrier between the first photosensitive resist layer 302 and the second photosensitive resist layer 310. The adhesive promoter is configured to promote adhesion between the first photosensitive resist layer 302 and the second photosensitive resist layer 310, which promotes a more precise formation of the aperture 322 described below. The mixing barrier is configured to reduce or prevent mixing between the first photosensitive resist layer 302 and the second photosensitive resist layer 310, to maximize the amount of the first-layer region 308 and a second-layer region 316 removed by the solvent 318, as will be explained in more detail below. The adhesive promoter and/or the mixing barrier can be applied onto the first photosensitive layer 302 before the second photosensitive resist layer 310 is applied onto the first photosensitive resist layer 302.

Figure 5:
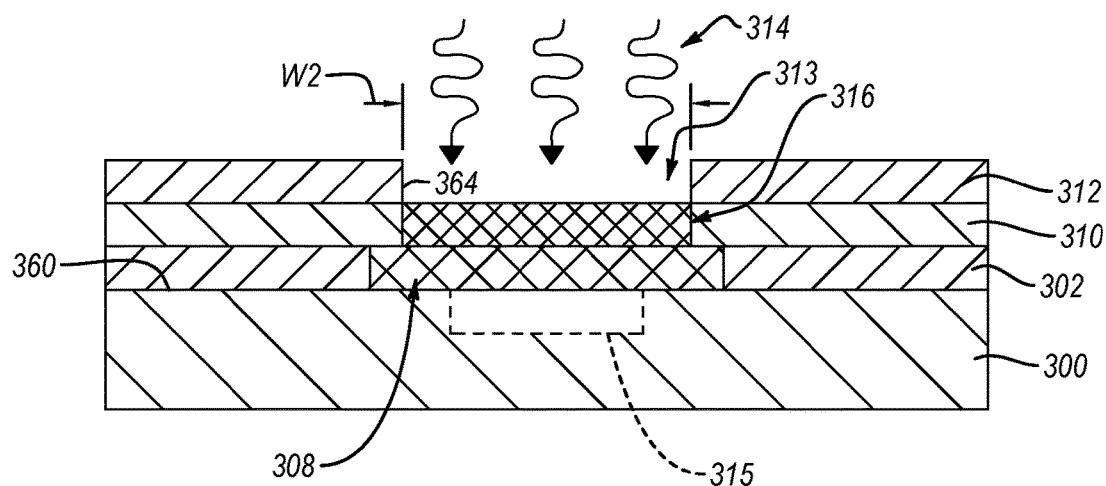
FIG. 5 is a schematic, side elevation sectional view of a second patterned mask on the second photosensitive resist layer of FIG. 4, according to one or more examples of the present disclosure.

Referring to FIGS. 5 and 28, after the second photosensitive resist layer 310 is applied onto the first photosensitive resist layer 302 at block 206, the method also 200 includes (block 208) exposing a portion of the second photosensitive resist layer 310 to light 314 such that a second-layer region 316 is defined by the portion of the second photosensitive resist layer 310 exposed to the light 314. The second-layer region 316 at least partially overlaps with the first-layer region 308. As used herein, the second-layer region 316 overlaps with the first-layer region 308 when a portion of the first-layer region 308 is interposed directly between at least a portion of the second-layer region 316 and the substrate 300. In some examples, as shown, a portion of the first-layer region 308 is interposed directly between an entirety of the second-layer region 316 and the substrate 300 such that the second-layer region 316 entirely overlaps with the first-layer region 308. Depending on the type of photosensitive resist material (i.e., positive or negative), the second-layer region 316 is the exposed portion of the photosensitive resist material when the material is a positive photoresist and the second-layer region 316 is an unexposed portion of the photosensitive resist material when the material is a negative photoresist. In the illustrated example, the second photosensitive resist layer 310 is made of a positive photoresist such that the second-layer region 316 is exposed to the light 314. Accordingly, in some examples, exposing the portion of the second photosensitive resist layer 310 to the light 314, to define the second-layer region 316, includes positioning a second patterned mask 312 onto the second photosensitive resist layer 310 and transmitting the light 314 through a second pattern 313, having at least one second-mask aperture 364, in the second patterned mask 312. The light 314 can be generated from the same light source and have the same properties as the light 306. Alternatively, in some examples, at least one of the light source or the properties associated with the light 314 is different than that of the light 306.

According to some examples, after or before exposing the portion of the second photosensitive resist layer 310 at block 208, the method 200 can include heat treating (e.g., baking) the second photosensitive resist layer 310. In some situations, the first photosensitive resist layer 302 is not heat treated before the second photosensitive resist layer 310 is heat treated, such that the heat treatment of the second photosensitive resist layer 310 can also act as a heat treatment for the first photosensitive resist layer 310.

The second-layer region 316 has a width W2 that corresponds with the width of the second-mask aperture 364. The width W2 corresponds with a dimension of the second-layer region 316 in the width direction 321 (see, e.g., FIG. 6). Moreover, the width W2 can be a maximum width or dimension of the second-layer region 316 in the width direction 321. When the second-mask aperture 364 has a circular cross-sectional shape, the width W2 is a diameter of the second-layer region 316. The width W2 also corresponds with a second-layer area of the second-layer region 316. The second-layer area of the second-layer region 316 is the area of the second-layer region 316 within a plane that is parallel to the width direction 321. Accordingly, the width W2 is a factor in the calculation of the second-layer area such that the second-layer area is dependent on (e.g., proportional to) the width W2.

The second-layer area of the second-layer region 316 is smaller than the first-layer area of the first-layer region 308. For example, the width W2 can be smaller than the width W1. Moreover, in some examples, the second-layer area is such that the second-layer region 316 is located within a footprint of the first-layer region 308. More specifically, an entirety of the second-layer region 316 can be located within a footprint of the first-layer region 308, which means, in plan view from a location perpendicular to the processing surface 360, an entirety of a projection of the second-layer region 316 onto the first-layer region 308 fits within the confines of the first-layer region 308.

Figure 6:
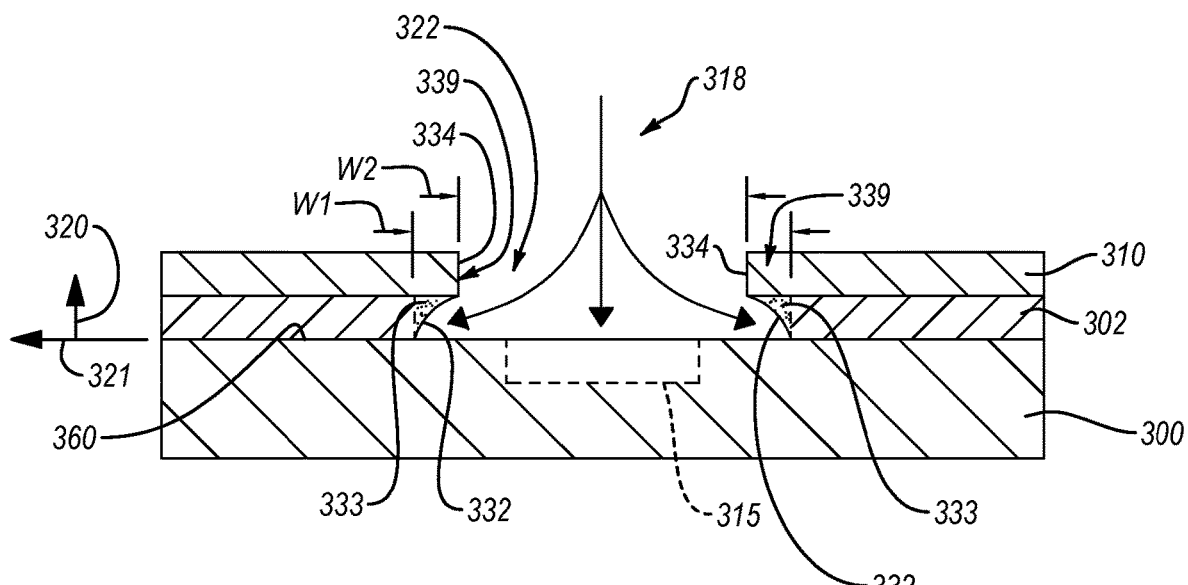
FIG. 6 is a schematic, side elevation sectional view of a solvent removing a portion of the first photosensitive resist layer and the second photosensitive resist layer of FIG. 5, according to one or more examples of the present disclosure.

Referring to FIGS. 6 and 28, after the second-layer region 316 is defined by exposing the portion of the second photosensitive resist layer 310 at block 208, the method 200 additionally includes (block 210) developing the first photosensitive resist layer 302 and the second photosensitive resist layer 310 to remove the second-layer region 316 and at least a portion of the first-layer region 308 such that an aperture 322 is formed through the first photosensitive layer 302 and the second photosensitive layer 310. As shown in FIG. 6, in some examples, developing the first photosensitive resist layer 302 and the second photosensitive resist layer 310 at block 210 includes exposing the first photosensitive resist layer 302 and the second photosensitive resist layer 310 to a solvent 318 (e.g., a developer solvent). The solvent 318 interacts with the first-layer region 308 and the second-layer region 316 to dissolve and remove the photosensitive resist material of the second-layer region 316 and to dissolve and remove at least a portion of the photosensitive resist material of the first-layer region 308. In some examples, the dissolving and removal of photosensitive resist material from the first-layer region 308 and the second-layer region 316 are done concurrently with the same solvent 318. However, in other examples, different solvents 318 are used in different stages of dissolving and removal. For examples, a first solvent can be used to remove photosensitive resist material from the first-layer region 308 and a second solvent, different than (e.g., a different type of solvent than) the first solvent, is used to remove photosensitive resist material from the second-layer region 316.

The portion of the first-layer region 308 that is removed has an area greater than the second-layer area of the second-layer region 316. Accordingly, a first portion 332 of the aperture 322 defined by the first photosensitive layer 302 has a maximum width that is greater than a maximum width of a second portion 334 of the aperture 322 defined by the second photosensitive layer 310. Because the second photosensitive layer 310 is applied onto the first photosensitive layer 302, and at least a portion of the first portion 332 of the aperture 322 is greater than the second portion 334 of the aperture 322, an overhanging portion 339 of the second photosensitive layer 310 overhangs the first photosensitive layer 302.

In some examples, an entirety of the first-layer region 308 is removed. However, in other examples, only a portion of the first-layer region 308 is removed. When only a portion of the first-layer region 308 is removed, the removed portion has an area greater than the second-layer area of the second-layer region 316, such that an overhanging portion 339 is still defined. Under some conditions, development of the first photosensitive resist layer 302 does not completely remove the first-layer region 308, such that an unremoved portion 333 of the first-layer region 308 remains after development. In some examples, the unremoved portion 333 is not removed due to mixing that may occur at the interface between the unexposed portion of the second photosensitive resist layer 310 and the exposed portion of the first photosensitive layer 302. Accordingly, the further away from the interface, the more the first-layer region 308 is removed. This phenomenon results in the aperture 322 having a width that decreases in a height direction 320 away from the processing surface 360. The height direction 320 is perpendicular to the width direction 321. Therefore, in some examples, the width of the first portion 332 of the aperture 322 decreases in the height direction 320 and the width of the second portion 334 of the aperture 322 is constant in the height direction 320. The width of the first portion 332 can decrease at a constant rate, such that the sidewalls of the first photosensitive resist layer 302 defining the aperture 322 are planar. However, as shown, in certain examples, the width of the first portion 332 decreases at variable rates (e.g., the rate increases the closer to the interface between the first photosensitive resist layer 302 and the second photosensitive resist layer 310), such that the sidewalls of the first photosensitive resist layer 302 defining the aperture 322 are curved (e.g., concave).

According to some examples, the amount and location of the material of the first-layer region 308 removed during block 210, and thus the shape of the aperture 322, can be controlled by controlling the material selected for the first photosensitive resist layer 302 and the second photosensitive resist layer 310, and/or the controlling the time period between applying the second photosensitive resist layer 310 onto the first photosensitive resist layer 302, at block 206, and exposing the portion of the second photosensitive resist layer 310 to the light 314, at block 208. The longer the time, the more mixing of the first photosensitive resist layer 302 and the second photosensitive resist layer 310. Moreover, the more mixing between these layers, the more material of the first photosensitive resist layer 302 that is not removed and forms the unremoved portion 333, which affects the shape (e.g., side profile) of the aperture 322. Accordingly, the materials and/or the above-mentioned time period can be selected to achieve a desired or predetermined mixing of the first photosensitive resist layer 302 and the second photosensitive resist layer 310 and/or a desired or predetermined side profile of the aperture 322.

In view of the foregoing, in some examples, a portion of the first photosensitive resist layer 302 remains underneath and in contact with the entirety of the second photosensitive resist layer 310. Accordingly, the unremoved portion 333 can help to support the overhanging portion 339 of the second photosensitive resist layer 310, which strengthens the overhanging portion 339 and prevents it from collapsing when material is applied onto the second photosensitive resist layer 310.

Because at least a portion of first-layer region 308 that is removed has an area greater that the second-layer region 316 that is removed (i.e., the maximum width of the first portion 332 of the aperture 322 is greater than that of the second portion 334 of the aperture 322), a portion of the second photosensitive resist layer 310 overhangs the first photosensitive resist layer 302 (i.e., the overhanging portion 339). In other words, a gap or portion of the aperture 322 is located below the overhanging portion 339 of the second photosensitive resist layer 310, between the second photosensitive resist layer 310 and the processing surface 360 along a plane parallel to the height direction 320.

Figure 7:
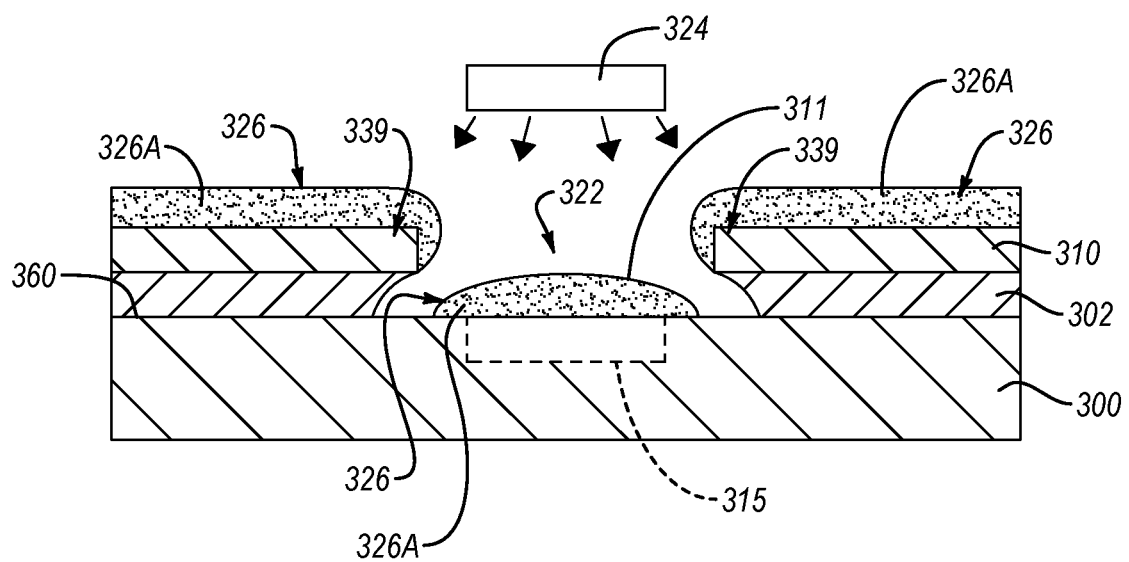
FIG. 7 is a schematic, side elevation sectional view of a metallic material being applied onto the second photosensitive resist layer and the substrate of FIG. 6, according to one or more examples of the present disclosure.
Figure 9:
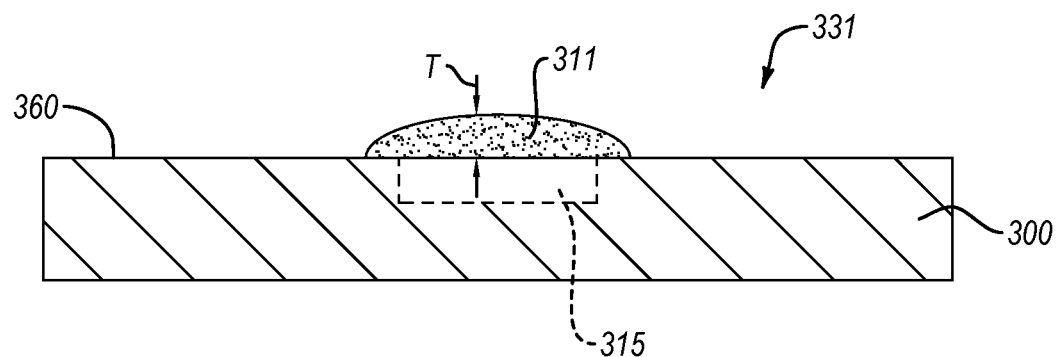
FIG. 9 is a schematic, side elevation sectional view of an electronic device, according to one or more examples of the present disclosure.

Referring to FIGS. 7 and 28, after the first photosensitive resist layer 302 and the second photosensitive resist layer 310 are developed at block 210, the method 200 includes (block 212) applying a material 326, which can be a metallic material 326 (e.g., an electrically conductive material), as described below, a non-metallic material (e.g., an electrically non-conductive material, such as a dielectric material), or a combination of a metallic and a non-metallic material, onto the substrate 300 through the aperture 322 formed in the first photosensitive resist layer 302 and the second photosensitive resist layer 310. Developing the first photosensitive resist layer 302 and the second photosensitive resist layer 310 to form the aperture 322 removes photosensitive resist material from the substrate and exposes a portion of the processing surface 360. The exposed portion of the processing surface 360 is accessible through the aperture 322. Accordingly, in certain examples, the material (e.g., the metallic material 326 or other material) can be applied onto the exposed portion of the processing surface 360 through the aperture 322. Depending on the material deposition process, some material may be applied onto the second photosensitive layer 310, such as onto the overhanging portion 339. Moreover, when the substrate 300 includes the connection circuit 315, the exposed portion of the processing surface 360 can include the connection circuit 315 such that the material applied onto the processing surface 360 contacts the connection circuit 315 and is capable of establishing an electrical connection with the connection circuit 315, such as when the material is the metallic material 326. In order to apply the metallic material 326 onto the connection circuit 315, the first patterned mask 304 and the second patterned mask 312 are arranged on the substrate 300 so that the first-layer region 308 and the second-layer region 316 overlay (e.g., are position above) the connection circuit 315. The metallic material 326 applied onto the substrate 300 defines the electrode 311, as shown in FIG. 9.

Figure 10:
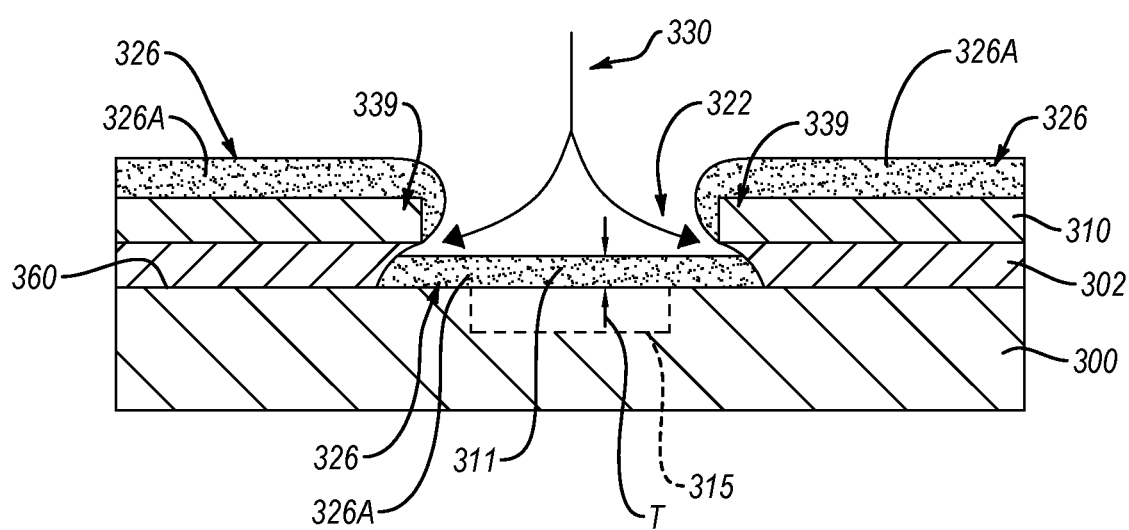
FIG. 10 is a schematic, side elevation sectional view of a solvent removing a first photosensitive resist layer and a second photosensitive resist layer from a substrate, according to one or more examples of the present disclosure.

When the material applied at block 212 is the metallic material, it can be applied onto the substrate 300 using any of various techniques, such as sputtering, plating, etc. Referring to FIG. 7, in one example, the metallic material 326 is sputtered onto the substrate 300 using a sputtering machine 324. Accordingly, the metallic material 326 is sputtering metallic material 326A, which is deposited onto all exposed surfaces facing and having light-of-sight with the sputtering machine 324. Accordingly, as shown in FIG. 7, the metallic material 326 is applied onto the second photosensitive resist layer 310, as well as the processing surface 360 of the substrate 300. Because the metallic material is sputtered broadly, some of the metallic material 326 can be deposited on vertical edges of the second photosensitive resist layer 310 and onto portions of the processing surface 360 underneath the second photosensitive resist layer 310. In some examples, as shown in FIG. 10, some of the metallic material 326 deposited on the processing surface 360 can reach and coat some of the portion of the first photosensitive resist layer 302 defining the aperture 322. In this manner, the metallic material 326 can have an area equal to the maximum area or maximum width W1 of the aperture 322 (i.e., greater than the second-layer area of the second-layer region 316. However, due to the overhang of the second photosensitive resist layer 310 over the first photosensitive resist layer 302, the sputtered metallic material cannot entirely coat the portion of the first photosensitive resist layer 302 defining the aperture 322, thus leaving at least some of the first photosensitive resist layer 302 exposed. A thickness of the metallic material 326 applied onto the substrate 300 defines a thickness T of the electrode 311.

Figure 13:
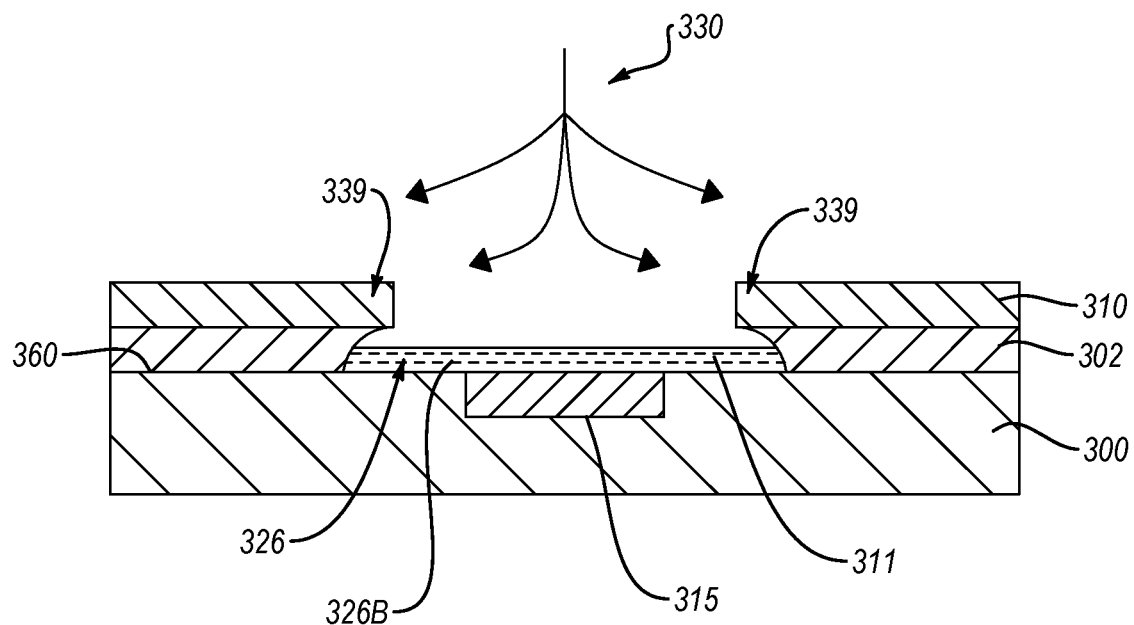
FIG. 13 is a schematic, side elevation sectional view of a solvent removing a first photosensitive resist layer and a second photosensitive resist layer from a substrate, according to one or more examples of the present disclosure.
Figure 14:
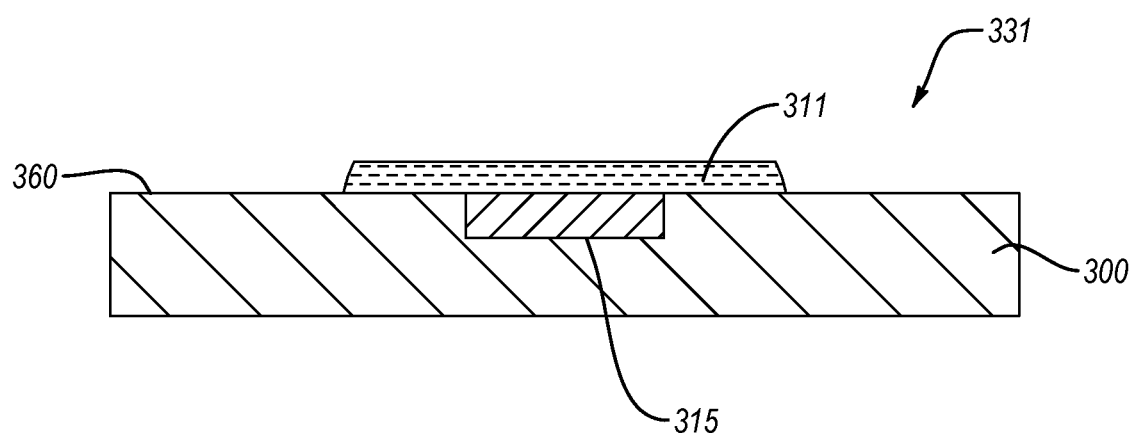
FIG. 14 is a schematic, side elevation sectional view of an electronic device, according to one or more examples of the present disclosure.
Figure 15:
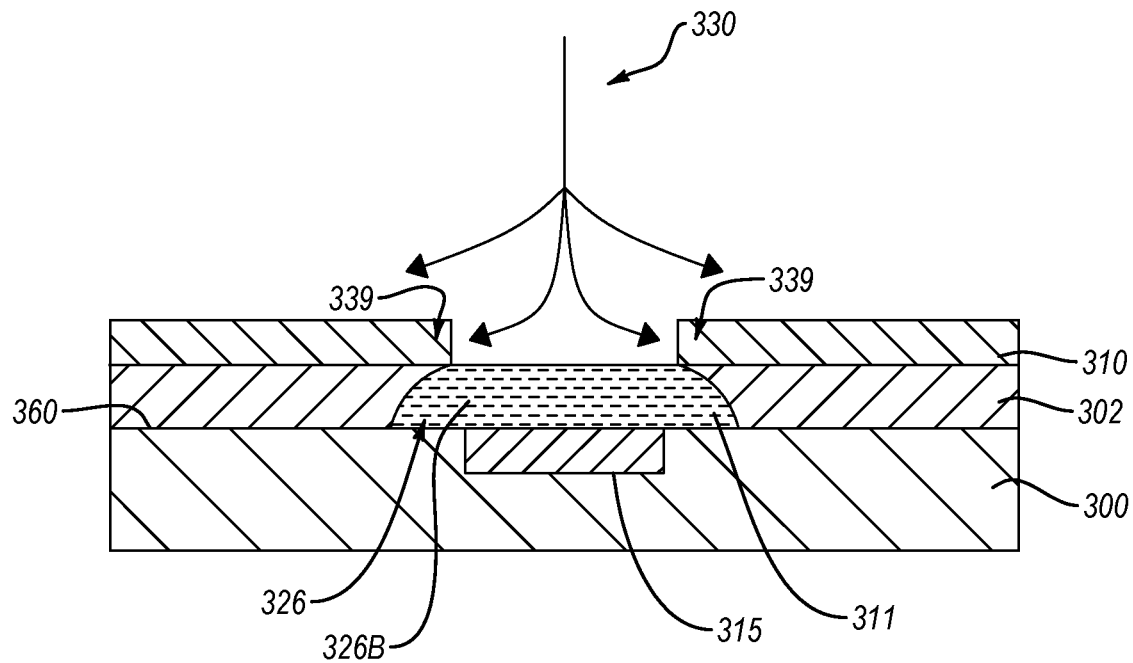
FIG. 15 is a schematic, side elevation sectional view of a solvent removing a first photosensitive resist layer and a second photosensitive resist layer from a substrate, according to one or more examples of the present disclosure.
Figure 16:
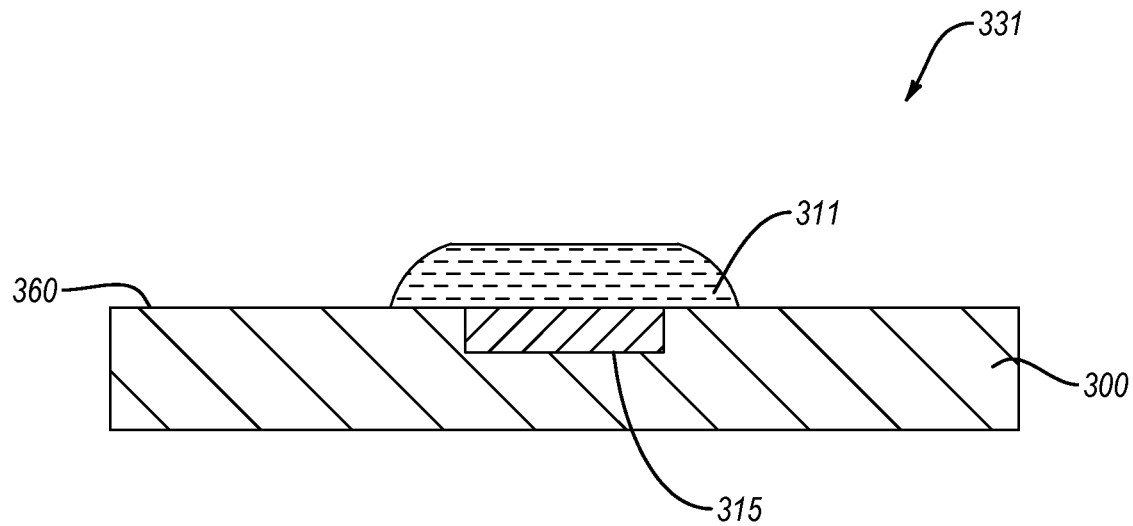
FIG. 16 is a schematic, side elevation sectional view of an electronic device, according to one or more examples of the present disclosure.
Figure 17:
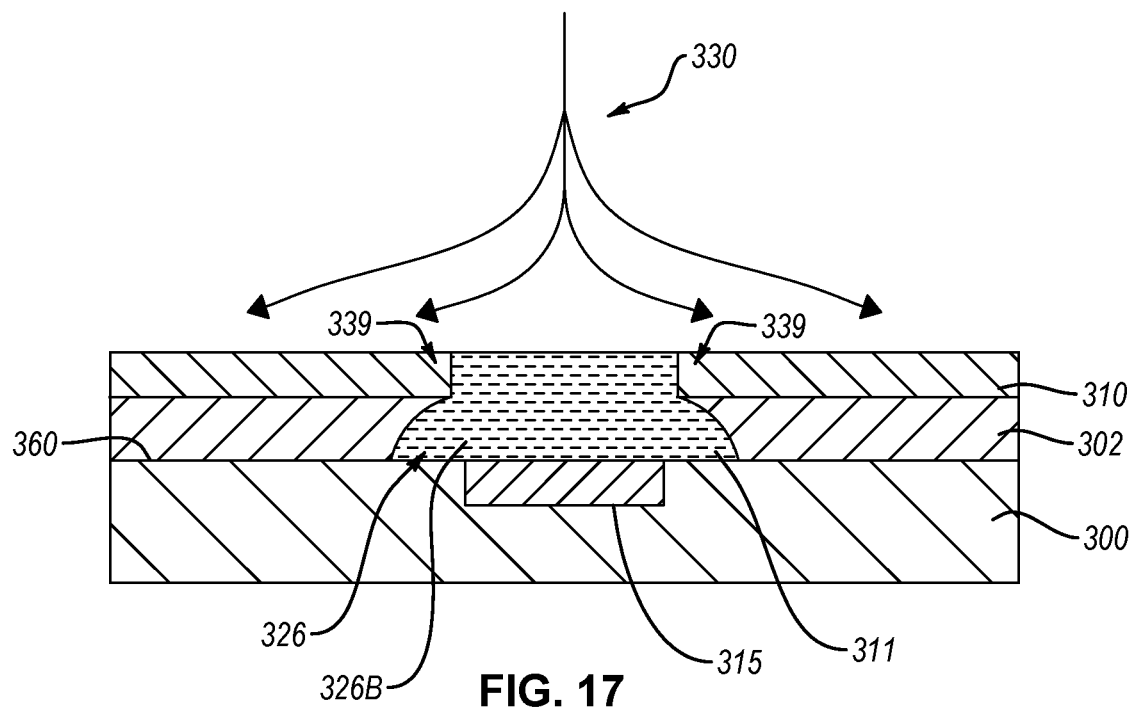
FIG. 17 is a schematic, side elevation sectional view of a solvent removing a first photosensitive resist layer and a second photosensitive resist layer from a substrate, according to one or more examples of the present disclosure.
Figure 18:
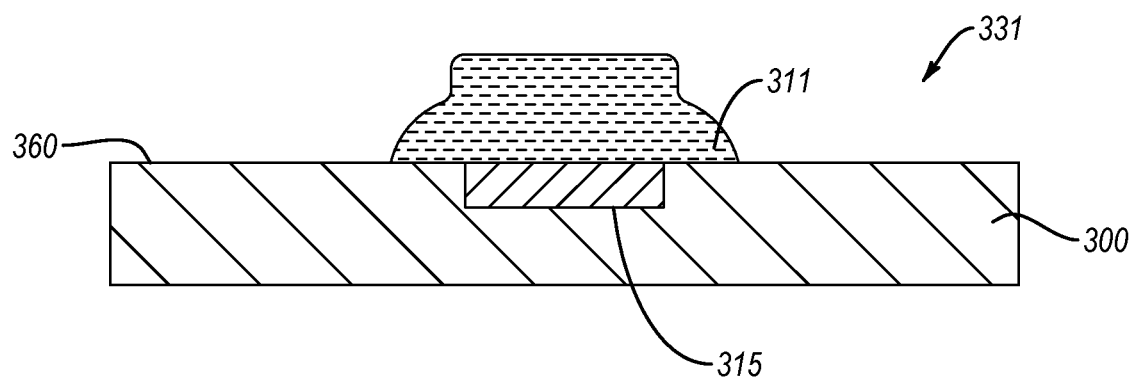
FIG. 18 is a schematic, side elevation sectional view of an electronic device, according to one or more examples of the present disclosure.

According to alternative examples, as shown in FIGS. 13, 15, and 17, the metallic material 326 is plated onto the substrate 300 using an electrochemical deposition technique, such as one that is similar to the one described above in association with the electrochemical deposition system 100. More specifically, by electrically energizing the connection circuit 315 of the substrate 300 via the formation of an electrical circuit with an energized electrode, and in the presence of an electrolytic solution, the metallic material 326 is deposited onto the connection circuit 315. Accordingly, the metallic material 326 in FIGS. 13, 15, and 17 is plating metallic material 326B. Moreover, such techniques can be used to widen the metallic material 326 to extend laterally beyond the connection circuit 315 as shown. Also, because electrochemical deposition techniques do not result in deposition of metallic material onto the second photosensitive resist layer 310, no portions of the first photosensitive resist layer 302 may need to be exposed to remove the first photosensitive resist layer 302 and the second photosensitive resist layer 310 from the substrate 300. Therefore, electrochemical deposition techniques can be used to fill just an entirety of the portion of the aperture 322 defined by the first photosensitive resist layer 302, as shown in FIG. 15, or an entirety of the aperture 322, as shown in FIG. 17. In certain examples, the plating metallic material 326B, plated onto the substrate 300, is a different type of material compared to the sputtering metallic material 326A, sputtered onto the substrate 300. The sputtering metallic material 326A is one of copper, titanium, platinum, or iridium in some examples, and the plating metallic material 326B is the same one or a different one of copper, titanium, platinum, or titanium in some examples. The metallic material 326 applied onto the substrate 300 defines the electrode 311, as shown in FIG. 10. A thickness of the metallic material 326 applied onto the substrate 300 defines a thickness T of the electrode 311. Although termed an electrode, as used herein, the electrode 311 can be defined as and used interchangeably with a metallization layer.

According to some additional examples, metallic material can be both sputtered and plated onto the substrate 300 to form an electrode 311 without the need to remask. Although not shown, in one example, the electrode 311 is made of a first layer of sputtering metallic material 326A, sputtered onto the substrate 300, and a second layer of plating metallic material 326B, plated onto the sputtered metallic material. Such an electrode can be formed by first sputtering the sputtering metallic material 326A onto the substrate 300 (see, e.g., FIG. 7), and then electrically energizing the sputtering metallic material 326A, via electrical energizing of the connection circuit 315, so that the plating metallic material 326B is electrochemically deposited onto the sputtering metallic material 326A. If needed, this process can be performed multiple times to form an electrode 311 with multiple sets of alternating sputtered and plated metallic layers. The plating metallic material 326B is plated onto the sputtering metallic material 326A through the aperture 322 when the at least one first photosensitive resist layer 302 and the at least one second photosensitive resist layer 310 are still applied on the substrate 300, in some examples. In other examples, the plating metallic material 326B is plated onto the sputtering metallic material 326A after the at least one first photosensitive resist layer 302 and the at least one second photosensitive resist layer 310 are removed from the substrate 300, as described below.

When the material applied at block 212 is a non-metallic material, it can be applied onto the substrate 300 using any of various techniques, such as physical evaporative vapor deposition (PVD) and the like.

Figure 8:
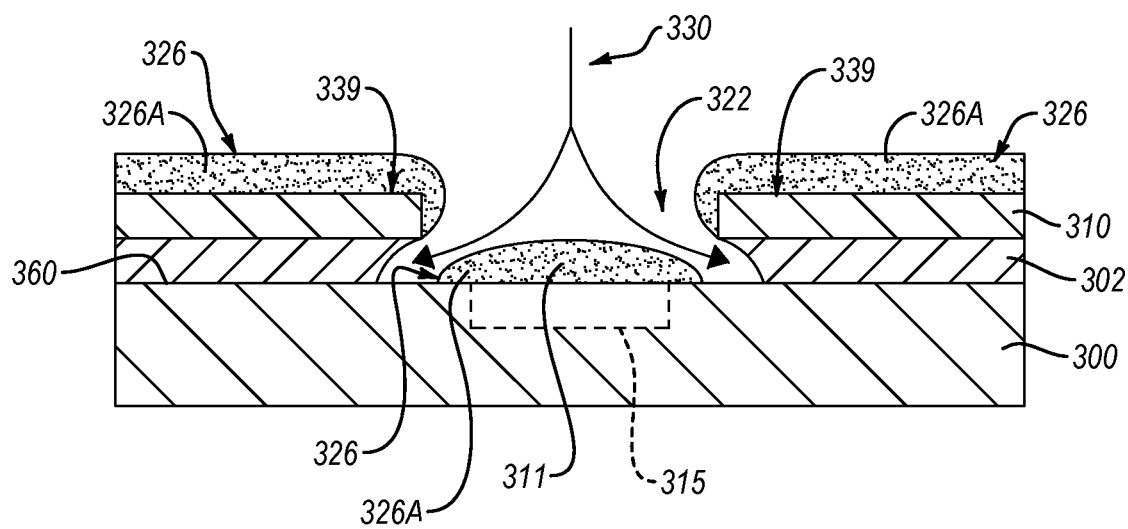
FIG. 8 is a schematic, side elevation sectional view of a solvent removing the first photosensitive resist layer and the second photosensitive resist layer of FIG. 7, according to one or more examples of the present disclosure.

Referring to FIGS. 8, 9, and 28, the method 200 additionally includes (block 214) removing the first photosensitive resist layer 302 and the second photosensitive resist layer 310 from the substrate 300. When the first photosensitive resist layer 302 and the second photosensitive resist layer 310 are removed from the substrate 300 at block 214, the material applied at block 212 that remains on the substrate 300 forms part of a device. For example, when the material applied at block 212 is the metallic material 326, the metallic material 326 that remains on the substrate 300 forms the electrode 111, and the substrate 300 and the electrode 111 together form at least part of an electronic device 331.

In the illustrated example of FIG. 8, block 214 is performed when a lift-off solvent 330 is brought into contact with the exposed portion of the first photosensitive resist layer 302 defining the aperture 322. The lift-off solvent 330 degrades and/or dissolves the first photosensitive resist layer 302 until the first photosensitive resist layer 302 is entirely dissolved or is released from the processing surface 360 of the substrate 300. The second photosensitive resist layer 310 can also be dissolved by the lift-off solvent 330 to remove the second photosensitive resist layer 310 from the substrate 300. Alternatively, as the first photosensitive resist layer 302 is released from the processing surface 360, the second photosensitive resist layer 310, being applied on the first photosensitive resist layer 302, is also released. Furthermore, if at block 212 the material is also applied onto the second photosensitive resist layer 310 as described above, the material on the second photosensitive resist layer 310 is removed from the substrate 300 as the second photosensitive resist layer 310 is removed from the substrate 300.

When the metallic material 326 is sputtered onto the substrate 300, a portion of the first photosensitive resist layer 302 must be exposed to the lift-off solvent to remove the first photosensitive resist layer 302 and the second photosensitive resist layer 310 because the second photosensitive resist layer 310 is covered by the metallic material 326. However, as shown in FIGS. 13-18, because the metallic material 326 does not cover the second photosensitive resist layer 310 when plated onto the substrate 300, the first photosensitive resist layer 302 does not need to be exposed initially to the lift-off solvent 330 to remove the photosensitive resist layers.

In certain examples of the method 200, the steps associated with blocks 202-214 can be iteratively performed, as indicated by the return arrow from block 214 back to 202, such as to form multiple electrodes on a substrate or to form an electrode having multiple layers. In some examples, for subsequent iterations, the first photosensitive resist layer can be applied onto only the substrate, onto only the material applied in a previous iteration, or onto both the substrate and the material applied in a previous iteration. Additionally, or alternatively, in some examples, a first iteration of the method 200 can apply material as a first layer (e.g., a first layer of an electrode) at block 212 using a first method, such as sputtering, and can apply material as a second layer (e.g., a second layer of the electrode) at block 212 of a subsequent iteration of the method 200 using the first method or a second method, such as plating, different than the first method. Iteratively forming multiple-layer features, such as electrodes, in this manner promotes forming features having complex, intricate, and precise size and shape requirements. Although sputtering and plating have been described, these are merely examples of various types of metallization techniques that can be used to apply metallic material at block 212 of method 200.

Figure 11:
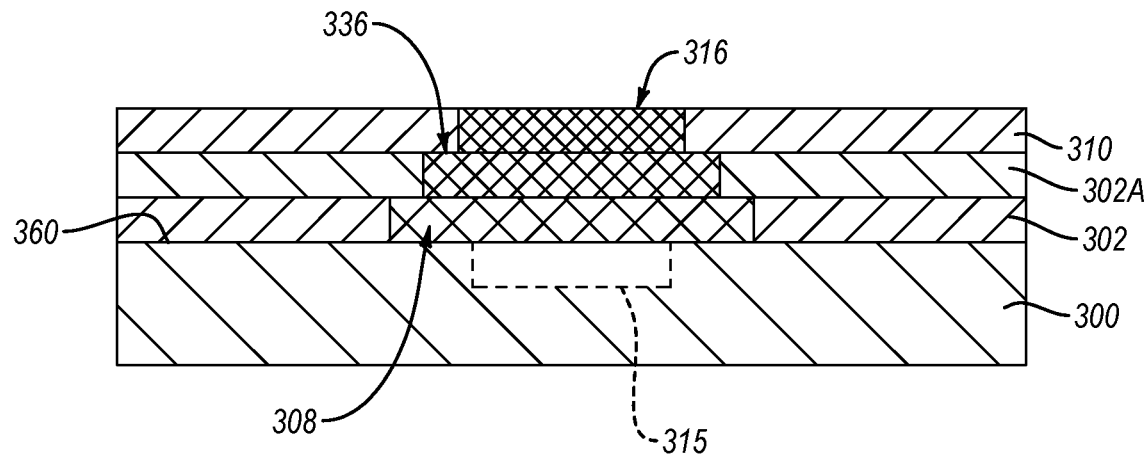
FIG. 11 is a schematic, side elevation sectional view of two first photosensitive resist layers and a second photosensitive resist layer on a substrate, according to one or more examples of the present disclosure.
Figure 12:
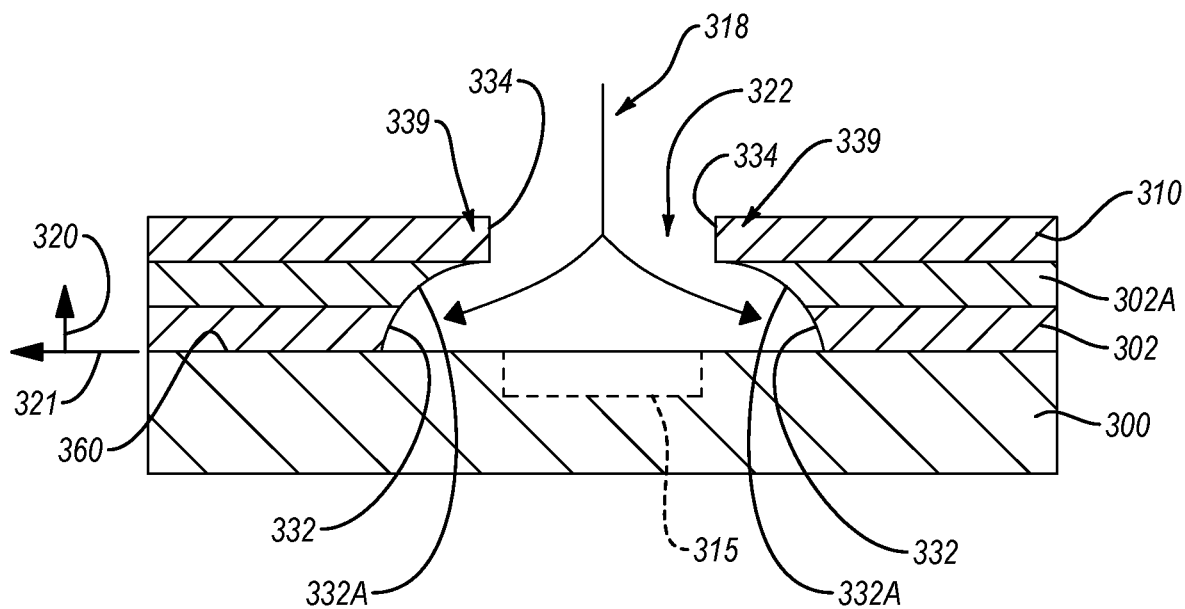
FIG. 12 is a schematic, side elevation sectional view of a solvent removing a portion of the two first photosensitive resist layers and the second photosensitive resist layer of FIG. 11, according to one or more examples of the present disclosure.

Referring to FIGS. 11 and 12, in some examples, more than one first photosensitive resist layer 302 is applied onto the substrate 300 before the second photosensitive resist layer 310. In the illustrated example of FIG. 11, two first photosensitive resist layers are applied onto the substrate 300. The two first photosensitive resist layers include the first photosensitive resist layer 302 and an intermediate first photosensitive resist layer 302A. In these examples, block 202 of the method 200 includes applying the first photosensitive resist layer 302 onto the substrate 300 and applying the intermediate first photosensitive resist layer 302A onto the first photosensitive resist layer 302. Additionally, block 204 of the method 200 includes exposing the portion of the first photosensitive resist layer 302 to the light 306, before applying the intermediate first photosensitive resist layer 302A onto the first photosensitive resist layer 302, and exposing a portion of the intermediate first photosensitive resist layer 302A to light such that an intermediate-layer region 336 is defined by the portion of the intermediate first photosensitive resist layer 302A exposed to the light. The intermediate-layer region 336 can have an intermediate-layer area that is less than the first-layer area of the first-layer region 308, but is greater than the second-layer area of the second-layer region 316. Accordingly, the areas of the second-layer region 316, the intermediate-layer region 336, and the first-layer region 308 get increasingly greater in a direction toward the substrate 300.

The use of the intermediate first photosensitive resist layer 302A, and the step-wise increase in the areas of these regions facilitated by the intermediate first photosensitive resist layer 302A, helps to more accurately and precisely control the variable width shape of the aperture 322. For example, developing the intermediate-layer region 336 at block 210 forms an intermediate portion 332A of the aperture 322, which has a width larger than the width W2 of the second portion 334 of the aperture 322 and smaller than the width W1 of the first portion 332 of the aperture 322. In certain examples, the solvent used to develop the intermediate-layer region 336 is different than the solvent used to develop the first-layer region 308.

In the illustrated examples of FIGS. 2-18, the processing surface 360 of the substrate 300 is planar (i.e., has a planar topography). However, as shown in FIGS. 19-24, the processing surface 360 of the substrate 300 can be engineered to be non-planar (i.e., has a non-planar topography) to facilitate thicker metallization with bi-layer photoresist layers. As used herein, the substrate 300 (e.g., the processing surface 360 of the substrate 300) is non-planar, or has a non-planar topography, when a rate of change of the height or elevation of the processing surface 360 changes across a width of the substrate 300 in the width direction 321. For example, a processing surface 360 having a non-planar topography can be contoured, curved, or have an increase in height and a decrease in height along its width. Such features may be utilized to enable thicker and/or higher volume material deposition on the substrate.

The non-planar topography of the processing surface 360 can be formed using any of various methods. In one example, the substrate 300 has a monolithic construction and the non-planar topography is machined, etched, molded, cast, extruded, etc. into the substrate. However, in other examples, as shown, the substrate 300 has a multi-piece construction. For example, the substrate 300 in the illustrated examples includes a base 350 and a topography layer 340 formed on the base 350. The topography layer 340 defines at least a portion of the non-planar topography of the processing surface 360 of the substrate 300. In some examples, the topography layer 340 and a portion of the base 350 collectively define the processing surface 360 of the substrate 300. The portion of the base 350 defining the processing surface 360 can include access to the connection circuit 315, which, as shown, can be integrated into the base 350. According to some examples, the topography layer 340 includes recesses 366 corresponding with the location of connection circuits 315, such that the connection circuits 315 are accessible through the recesses 366. The topography layer 340 can then act as an insulating layer that laterally insulates electrodes formed on the connection circuits 315. For example, the topography layer 340 can be an organic material (e.g., polyimide, acrylic, etc.), an inorganic material (e.g., SiNx, SiO2, etc.), alone or in combination.

Figure 19:
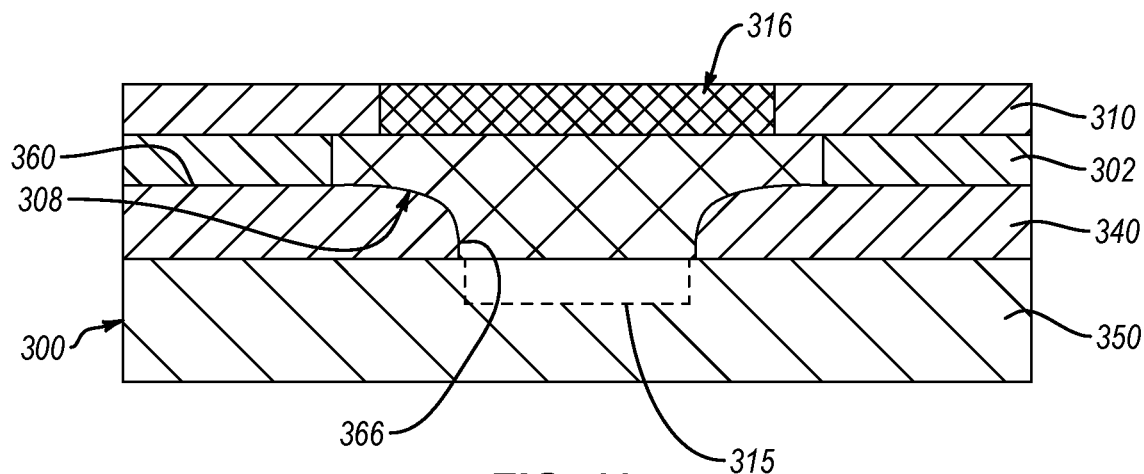
FIG. 19 is a schematic, side elevation sectional view of a first photosensitive resist layer and a second photosensitive resist layer on a substrate having a non-planar topography, according to one or more examples of the present disclosure.
Figure 20:
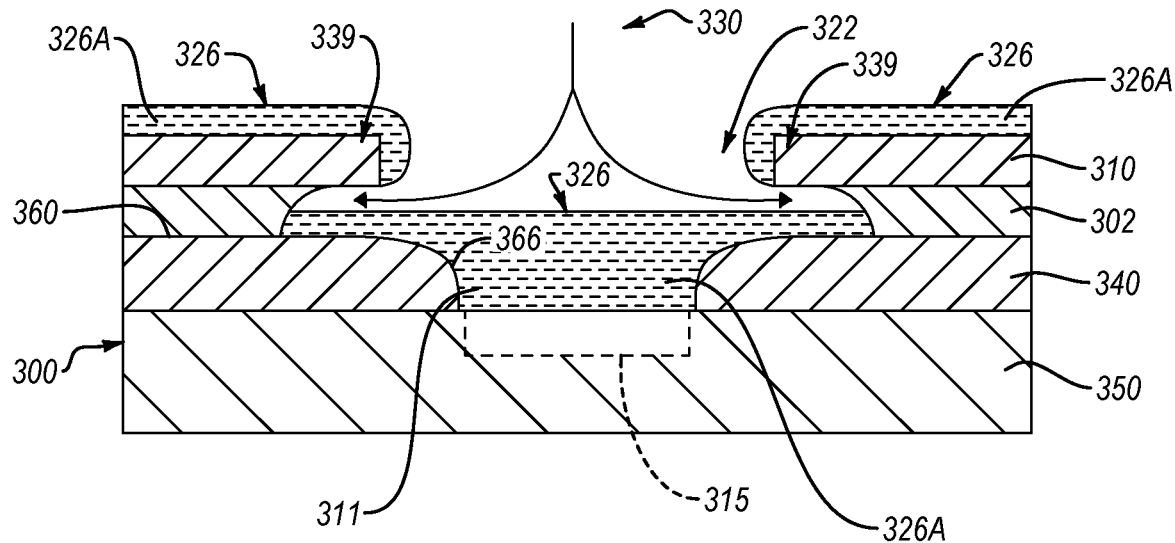
FIG. 20 is a schematic, side elevation sectional view of a solvent removing the first photosensitive resist layer and the second photosensitive resist layer of FIG. 19, according to one or more examples of the present disclosure.
Figure 21:
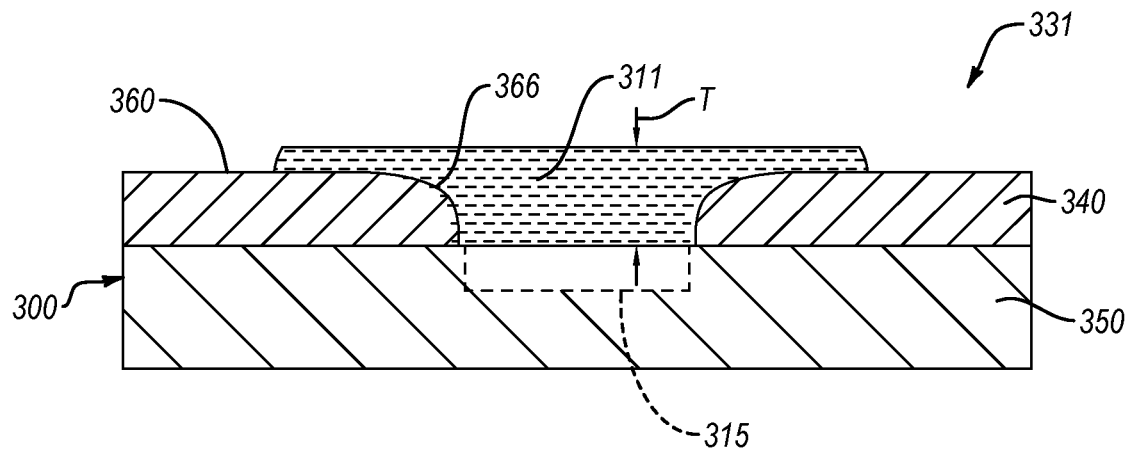
FIG. 21 is a schematic, side elevation sectional view of an electronic device, according to one or more examples of the present disclosure.

Referring to FIGS. 19-21, in some examples, the recess 366 is at least as wide as the connection circuit 315. The first photosensitive resist layer 302 is applied onto the topography layer 340, into the recess 366, and onto the base 350 exposed through recess 366 at block 202 of the method 200. Moreover, at block 204 of the method 200, the portion of the first photosensitive resist layer 302 within the recess 366 is exposed and forms part of the first-layer region 308. In certain examples, the first-layer region 308 and the second-layer region 316 are wider than the recess 366, such that when developed, the aperture 322 is wider than the recess 366. In this manner, when the material (e.g., the metallic material 326) is applied at block 212, such as by using a sputtering-type technique, some of the material is applied onto the topography layer 340 and remains on the topography layer 340 after the first photosensitive resist layer 302 and the second photosensitive resist layer 310 are removed at block 210. Moreover, because the recess 366 is at least as wide as the connection circuit 315, the portion of the electrode 311 in contact with the connection circuit 315 is at least as wide (e.g., wider than) the connection circuit 315. Material remaining on the topography layer 340 may not negatively affect functionality of the electronic device 331 because the topography layer 340 forms a permanent part of the substrate 300 and the electronic device 331. Additionally, when the material applied is the metallic material 326, due to the increased thickness of the topography layer 340, the thickness of the metallic material 326, which defines the thickness T of the electrode 311, can be more easily and reliably increased, relative to the thickness of the metallic material formed without a topography layer 340, such as shown in FIGS. 2-9.

Figure 22:
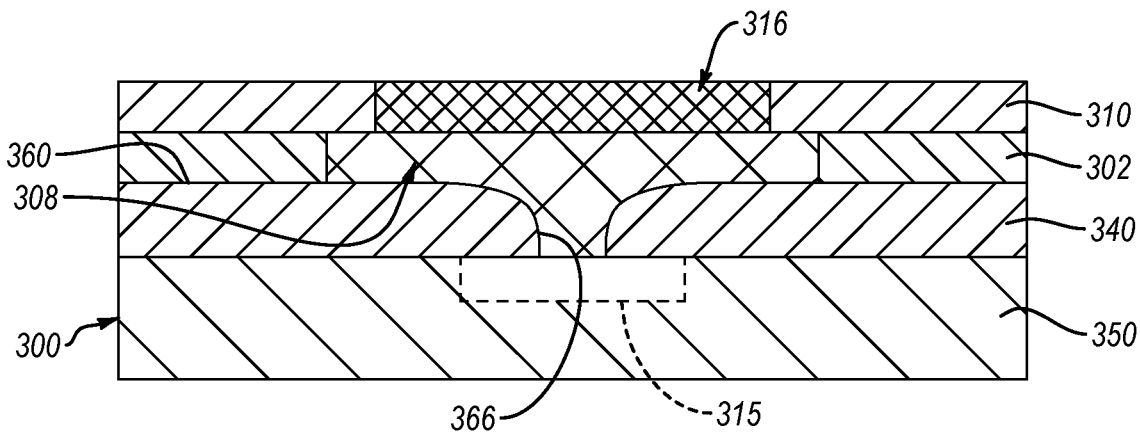
FIG. 22 is a schematic, side elevation sectional view of a first photosensitive resist layer and a second photosensitive resist layer on a substrate having a non-planar topography, according to one or more examples of the present disclosure.
Figure 23:
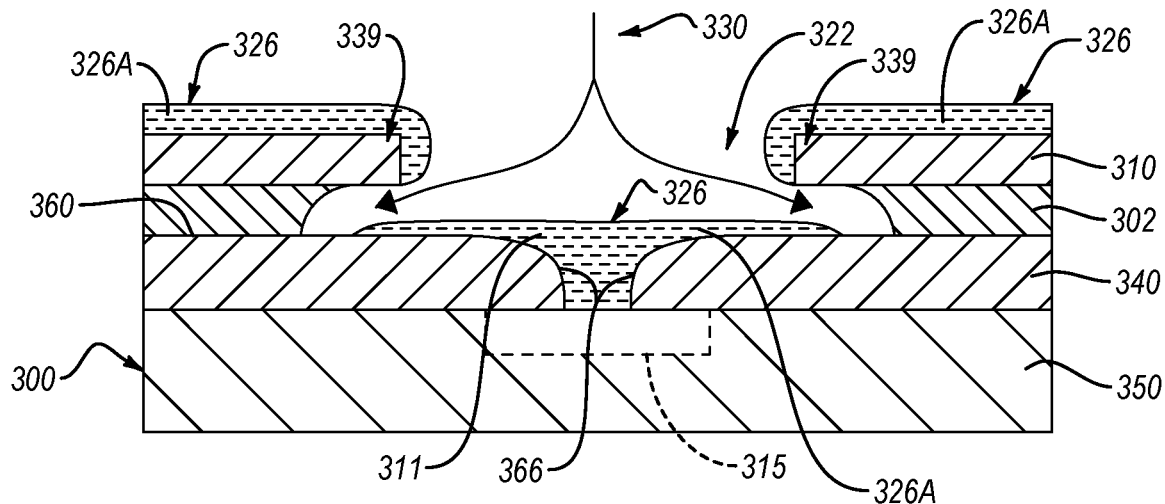
FIG. 23 is a schematic, side elevation sectional view of a solvent removing the first photosensitive resist layer and the second photosensitive resist layer of FIG. 19, according to one or more examples of the present disclosure.
Figure 24:
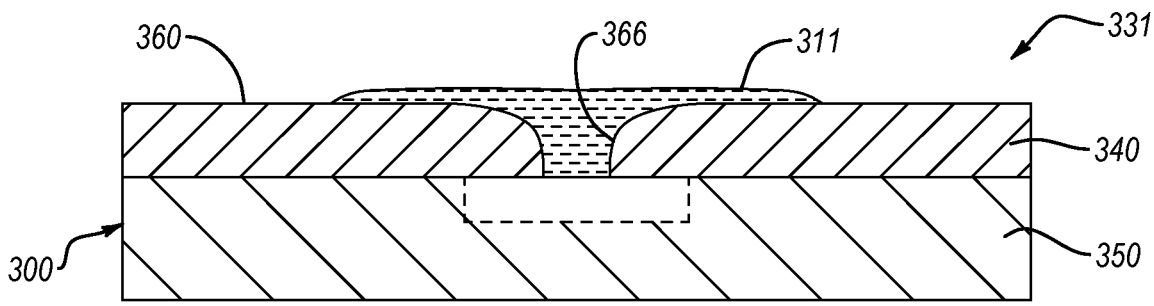
FIG. 24 is a schematic, side elevation sectional view of an electronic device, according to one or more examples of the present disclosure.

Referring to FIGS. 22-24, in some examples, the recess 366 is narrower than the connection circuit 315. Because the recess 366 is narrower than the connection circuit 315, the portion of the electrode 311 in contact with the connection circuit 315 is narrower than the connection circuit 315.

Although FIGS. 19-24 show the photosensitive resist layers and metallic material being applied onto the topography layer 340 of a substrate having a multi-piece construction, it is recognized that the same principles can apply to a substrate having a monolithic construction where the topography layer 340 is effectively co-formed with the base.

Figure 25:
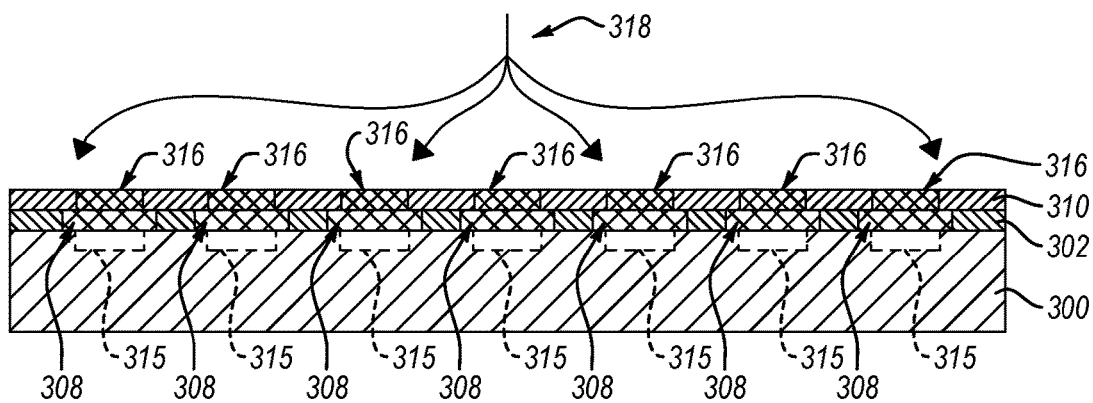
FIG. 25 is a schematic, side elevation sectional view of a first photosensitive resist layer and a second photosensitive resist layer on a substrate, according to one or more examples of the present disclosure.
Figure 26:
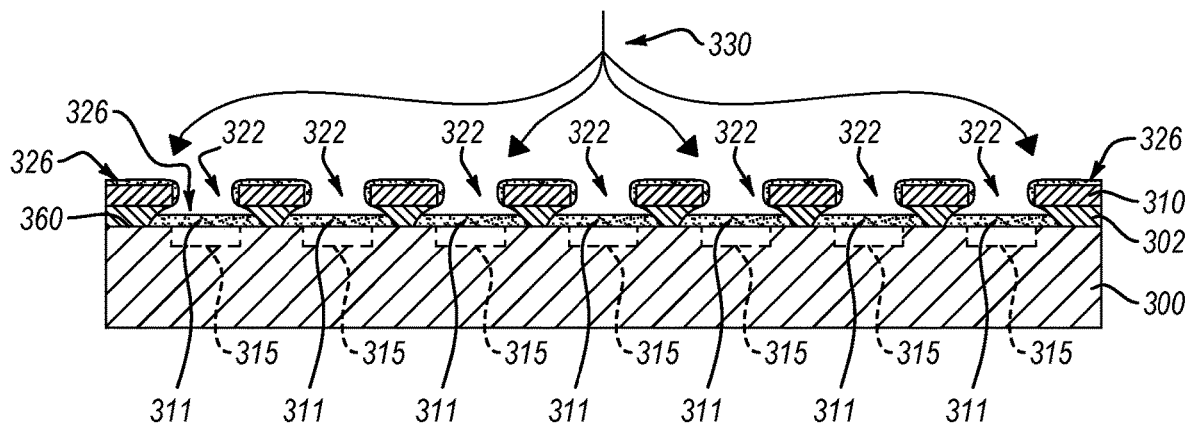
FIG. 26 is a schematic, side elevation sectional view of a solvent removing the first photosensitive resist layer and the second photosensitive resist layer of FIG. 25, according to one or more examples of the present disclosure.
Figure 27:
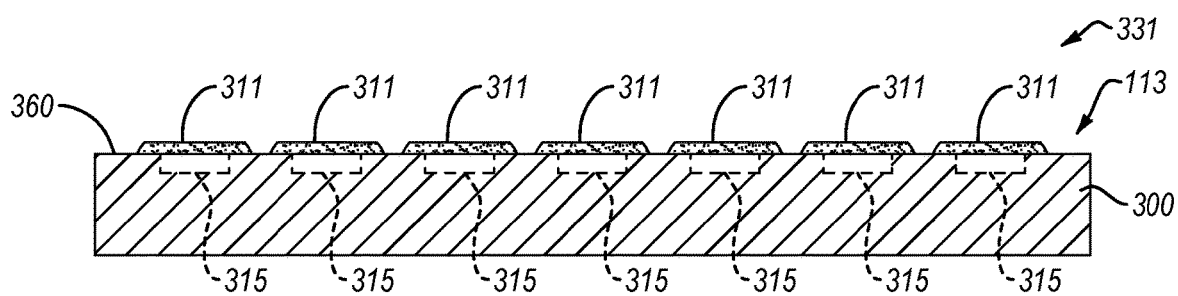
FIG. 27 is a schematic, side elevation sectional view of an electronic device, according to one or more examples of the present disclosure.

Referring to FIGS. 25-27, in some examples, the method 200 is performed to form multiple electrodes 311 on the substrate 300. For example, at block 204, and shown in FIG. 25, the portion of the first photosensitive resist layer 302 is exposed to the light 306 such that a plurality of first-layer regions 308, spaced apart from each other, are formed. This can be accomplished by using a first patterned mask 304 with a plurality of first-mask apertures 362 that are spaced apart from each other. Similarly, the portion of the second photosensitive resist layer 310 is exposed to the light 314 such that a plurality of second-layer regions 316, spaced apart from each other, are formed. This can be accomplished by using a second patterned mask 312 with a plurality of second-mask apertures 364 that are spaced apart from each other. When the first photosensitive resist layer 302 and the second photosensitive resist layer 310 are developed at block 210, a plurality of apertures 322 are formed where material forming the plurality of first-layer regions 308 and the plurality of second-layer regions 316 is removed. Referring to FIG. 26, metallic material 326 is then applied onto the substrate 300 through each of the plurality of apertures 322, which are spaced apart from each other, such that multiple, spaced-apart deposits of the material 326, defining multiple, spaced-apart electrodes 311, are formed on the substrate 300, and the photosensitive resist layers are removed. In some examples, metallic material 326 is applied onto the substrate 300 through less than all of the plurality of apertures 322. As shown in FIG. 27, the shape of the apertures 322, having a decreasing width in the height direction 320 away from the substrate 300, helps to laterally contain the application of the metallic material 326, to prevent the formation of laterally extending wings, flags, fencing features around the material, such that multiple electrodes 311, in close proximity to each other, remain electrically isolated from each other. Also, as mentioned, the shape of the apertures 322 can facilitate denser electrode arrays and promote an increase in the amount of metal for the electrodes without a change in the array pitch.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagram included herein is generally set forth as logical flow chart diagram. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not adhere to the order of the corresponding steps shown. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented.

The present subject matter may be embodied in other specific forms without departing from its spirit or essential characteristics. The described examples are to be considered in all respects only as illustrative and not restrictive. All changes which come within the meaning and range of equivalency of the claims are to be embraced within their scope.

What is claimed is:

1. A method of forming a printhead of an electrochemical deposition system, the method comprising:
    applying at least one first photosensitive resist layer onto a substrate comprising a connection circuit;
    exposing a portion of the at least one first photosensitive resist layer to a first light such that a plurality of first-layer regions, spaced apart from each other, are defined by the portion of the at least one first photosensitive resist layer exposed to the first light;
    applying at least one second photosensitive resist layer onto the at least one first photosensitive resist layer;
    exposing a portion of the at least one second photosensitive resist layer to a second light such that a plurality of second-layer regions, spaced apart from each other and each located within a footprint of a corresponding one of the plurality of first-layer regions, are defined by the portion of the at least one second photosensitive resist layer exposed to the second light;

developing the at least one first photosensitive resist layer and the at least one second photosensitive resist layer to remove the plurality of second-layer regions and at least a portion of each one of the plurality of first-layer regions, such that a plurality of apertures are formed through the at least one first photosensitive layer and the at least one second photosensitive layer and such that an overhanging portion of the at least one second photosensitive layer overhangs the at least one first photosensitive layer;

applying a metallic material onto the substrate through one or more of the plurality of apertures such that the metallic material is capable of establishing an electrical connection with the connection circuit; and removing the at least one first photosensitive resist layer and the at least one second photosensitive resist layer from the substrate.

2. The method according to claim 1, wherein applying the metallic material onto the substrate comprises sputtering a sputtering metallic material onto the substrate.

3. The method according to claim 2, wherein applying the metallic material onto the substrate further comprises plating a plating metallic material onto the sputtering metallic material by electrically energizing the connection circuit.

4. The method according to claim 3, wherein the step of plating the plating metallic material onto the sputtering metallic material, by electrically energizing the connection circuit, occurs after the step of removing the at least one first photosensitive resist layer and the at least one second photosensitive resist layer from the substrate.

5. The method according to claim 2, wherein an area of the metallic material applied onto the connection circuit is greater than an area occupied by the connection circuit.

6. The method according to claim 2, wherein an area of the metallic material applied onto the connection circuit is less than an area occupied by the connection circuit.

7. The method according to claim 1, wherein:
applying the metallic material onto the substrate comprises applying a layer of the metallic material onto the substrate, through the aperture, and onto the at least one second photosensitive resist layer; and
removing the at least one first photosensitive resist layer and the at least one second photosensitive resist layer from the substrate also removes a portion of the layer of the metallic material on the at least one second photosensitive resist layer.

8. The method according to claim 1, wherein an area of the metallic material applied onto the substrate is greater than a second-layer area of the second-layer region.

9. The method according to claim 1, wherein:
exposing the portion of the at least one first photosensitive resist layer to the first light to define the first-layer region comprises positioning a first patterned mask onto the at least one first photosensitive resist layer and transmitting the first light through a pattern in the first patterned mask; and
exposing the portion of the second photosensitive resist layer to the second light to define the second-layer region comprises positioning a second patterned mask onto the at least one second photosensitive resist layer and transmitting the second light through a pattern in the second patterned mask.

10. The method according to claim 1, wherein developing the at least one first photosensitive resist layer and the at least one second photosensitive resist layer comprises concurrently exposing the first-layer region and the second-layer region to at least one solvent.

11. The method according to claim 1, wherein:
the at least one first photosensitive resist layer defines a first portion of the aperture having a first width in a width direction;
the at least one second photosensitive resist layer defines a second portion of the aperture having a second width in the width direction; and
the first width is greater than the second width.

12. The method according to claim 11, wherein:
the second width is constant in a height direction away from the substrate and perpendicular to the width direction; and
the first width decreases in the height direction.

13. The method according to claim 1, wherein the at least one first photosensitive resist layer comprises at least two first photosensitive resist layers.

14. The method according to claim 13, wherein:
a first-layer area of a portion of the first-layer region defined by an inner one of the at least two first photosensitive resist layers is greater than a first-layer area of a portion of the first-layer region defined by an outer one of the at least two first photosensitive resist layers; and
the outer one of the at least two first photosensitive resist layers is interposed between the inner one of the at least two first photosensitive resist layers and the at least one second photosensitive resist layer.

15. The method according to claim 1, wherein:
the substrate has a non-planar topography;
the at least one first photosensitive resist layer is applied onto the non-planar topography of the substrate; and
the metallic material is applied onto the non-planar topography of the substrate through the aperture.

16. The method according to claim 15, wherein:
the substrate comprises a base and a polyimide insulator layer coupled to the base; and
the non-planar topography is defined by the polyimide insulator layer.

17. The method according to claim 1, further comprising heat treating the at least one first photosensitive resist layer after exposing the portion of the at least one first photosensitive resist layer to the first light and before applying the at least one second photosensitive resist layer onto the at least one first photosensitive resist layer.

18. The method according to claim 1, wherein:
the at least one first photosensitive resist layer is made of a first photosensitive resist material;
the at least one second photosensitive resist layer is made of a second photosensitive resist material; and
the first photosensitive resist material and the second photosensitive resist material are different types of photosensitive resist material.

19. The method according to claim 1, further comprising applying at least one of an adhesive promoter or a mixing barrier between the at least one first photosensitive resist layer and the at least one second photosensitive resist layer.

20. The method according to claim 1, wherein the at least one first photosensitive resist layer and the at least one second photosensitive resist layer are made of the same type of photosensitive resist material.

21. The method according to claim 1, wherein the at least one first photosensitive resist layer and the at least one second photosensitive resist layer are made of a positive photosensitive resist material.

22. The method according to claim 1, wherein the at least one first photosensitive resist layer and the at least one second photosensitive resist layer are made of a negative photosensitive resist material.

23. The method according to claim 1, wherein one of the at least one first photosensitive resist layer and the at least one second photosensitive resist layer is made of a positive photosensitive resist material and the other one of the at least one first photosensitive resist layer and the at least one second photosensitive resist layer is made of a negative photosensitive resist material.

24. The method according to claim 1, further comprising selecting a time period between applying the at least one second photosensitive resist layer onto the at least one first photosensitive resist layer and exposing the portion of the at least one second photosensitive resist layer to the second light based on a predetermined mixing of the at least one first photosensitive resist layer and the at least one second photosensitive resist layer.

25. The method according to claim 1, further comprising selecting a time period between applying the at least one second photosensitive resist layer onto the at least one first photosensitive resist layer and exposing the portion of the at least one second photosensitive resist layer to the second light based on a predetermined side profile of the aperture.

26. The method according to claim 1, wherein:
applying the at least one first photosensitive resist layer onto the substrate comprises at least one of spin coating, slot-die coating, doctor blading, or bar coating the at least one first photosensitive resist layer onto the substrate; and
applying the at least one second photosensitive resist layer onto the at least one first photosensitive resist layer comprises at least one of spin coating, slot-die coating, doctor blading, or bar coating the at least one second photosensitive resist layer onto the at least one first photosensitive resist layer.

27. A method, comprising:
applying at least one first photosensitive resist layer onto a substrate;
exposing a portion of the at least one first photosensitive resist layer to a first light such that a plurality of first-layer regions, spaced apart from each other, are defined by the portion of the at least one first photosensitive resist layer exposed to the first light;
applying at least one second photosensitive resist layer onto the at least one first photosensitive resist layer;
exposing a portion of the at least one second photosensitive resist layer to a second light such that a plurality of second-layer regions, spaced apart from each other and each located within a footprint of a corresponding one of the plurality of first-layer regions, are defined by the portion of the at least one second photosensitive resist layer exposed to the second light; and
developing the at least one first photosensitive resist layer and the at least one second photosensitive resist layer to remove the plurality of second-layer regions and at least a portion of each one of the plurality of first-layer regions, such that a plurality of apertures are formed through the at least one first photosensitive layer and the at least one second photosensitive layer and such that an overhanging portion of the at least one second photosensitive layer overhangs the at least one first photosensitive layer.

* * * * *